United States Patent
Yang et al.

(10) Patent No.: US 12,541,148 B2
(45) Date of Patent: Feb. 3, 2026

(54) COMPOUND, PHOTOSENSITIVE RESIN COMPOSITION INCLUDING THE SAME, COLOR FILTER, AND CMOS IMAGE SENSOR

(71) Applicant: SAMSUNG SDI CO., LTD., Yongin-si (KR)

(72) Inventors: Yeji Yang, Suwon-si (KR); Sundae Kim, Suwon-si (KR); Young Lee, Suwon-si (KR); Chaehyuk Ko, Suwon-si (KR); Ieju Kim, Suwon-si (KR); Baek Soung Park, Suwon-si (KR); Myungho Cho, Suwon-si (KR); Xinhui Feng, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 762 days.

(21) Appl. No.: 17/871,210

(22) Filed: Jul. 22, 2022

(65) Prior Publication Data

US 2023/0112667 A1    Apr. 13, 2023

(30) Foreign Application Priority Data

Jul. 23, 2021   (KR) .................... 10-2021-0097266

(51) Int. Cl.
  *G03F 7/004*  (2006.01)
  *C09B 57/00*  (2006.01)
  *G02B 5/20*   (2006.01)
  *G03F 7/00*   (2006.01)

(52) U.S. Cl.
  CPC .......... *G03F 7/0045* (2013.01); *C09B 57/007* (2013.01); *G02B 5/20* (2013.01); *G03F 7/0007* (2013.01)

(58) Field of Classification Search
  CPC .............................. C09B 57/00; C09B 57/007
  See application file for complete search history.

(56) References Cited

U.S. PATENT DOCUMENTS

| 8,241,852 B2 | 8/2012 | Yue et al. |
| 11,041,073 B2 * | 6/2021 | Jeong .................... G03F 7/0007 |
| 2010/0285470 A1 | 11/2010 | Brush et al. |
| 2011/0118459 A1 * | 5/2011 | Smith .................. C07D 403/12 |
| | | 540/465 |
| 2019/0144678 A1 | 5/2019 | Matray |

(Continued)

FOREIGN PATENT DOCUMENTS

| CN | 107793327 A * | 3/2018 | .......... C07C 211/64 |
| CN | 111142331 A | 5/2020 | |

(Continued)

OTHER PUBLICATIONS

Office Action (including a search report) dated Oct. 9, 2023, of the corresponding Chinese Patent Application No. 202210867657.2.
Korean Notice of Allowance dated Aug. 7, 2025.

*Primary Examiner* — Amanda C. Walke
(74) *Attorney, Agent, or Firm* — Lee IP Law, P.C.

(57) ABSTRACT

A compound, a photosensitive resin composition including the same, a color filter manufactured using the photosensitive resin composition, and a CMOS image sensor including the color filter, the compound being represented by Chemical Formula 1:

A-L-B.                                    [Chemical Formula 1]

20 Claims, 1 Drawing Sheet

(56) References Cited

U.S. PATENT DOCUMENTS

| | | | |
|---|---|---|---|
| 2019/0382587 A1 | 12/2019 | Seo et al. | |
| 2020/0142301 A1 | 5/2020 | Kwon et al. | |
| 2020/0308099 A1 | 10/2020 | Jeong et al. | |
| 2023/0136349 A1 * | 5/2023 | Yang | G03F 7/0045 430/280.1 |

FOREIGN PATENT DOCUMENTS

| | | | | |
|---|---|---|---|---|
| CN | 111880373 A | | 11/2020 | |
| JP | 2002-540279 A | | 11/2002 | |
| JP | 2016-069462 A | | 5/2016 | |
| JP | 2019-532145 A | | 11/2019 | |
| JP | 2019-532918 A | | 11/2019 | |
| JP | 2020184073 A | * | 11/2020 | C08K 9/04 |
| JP | 2023-001891 A | | 1/2023 | |
| KR | 10-2007-0116118 A | | 12/2007 | |
| KR | 10-2018-0019978 | | 2/2018 | |
| KR | 10-2018-0020031 A | | 2/2018 | |
| KR | 10-2018-0024290 | | 3/2018 | |
| KR | 10-2018-0035077 | | 4/2018 | |
| KR | 10-2019-0008308 A | | 5/2019 | |
| KR | 10-2059022 B1 | | 12/2019 | |
| KR | 10-2020-0023948 | | 3/2020 | |
| KR | 10-2020-0052160 A | | 5/2020 | |
| KR | 10-2020-0127482 | | 11/2020 | |
| KR | 10-2020-0144379 | | 12/2020 | |
| KR | 20200144379 A | * | 12/2020 | |
| KR | 10-2021-0028564 A | | 3/2021 | |
| TW | 202041602 A | | 11/2020 | |
| WO | WO 00/58405 A2 | | 10/2000 | |
| WO | WO 2011/087521 A1 | | 7/2011 | |
| WO | WO-2018043829 A1 | * | 3/2018 | C07C 211/64 |
| WO | WO-2018056546 A1 | * | 3/2018 | C07C 211/64 |
| WO | WO 2018/062663 A1 | | 4/2018 | |

* cited by examiner

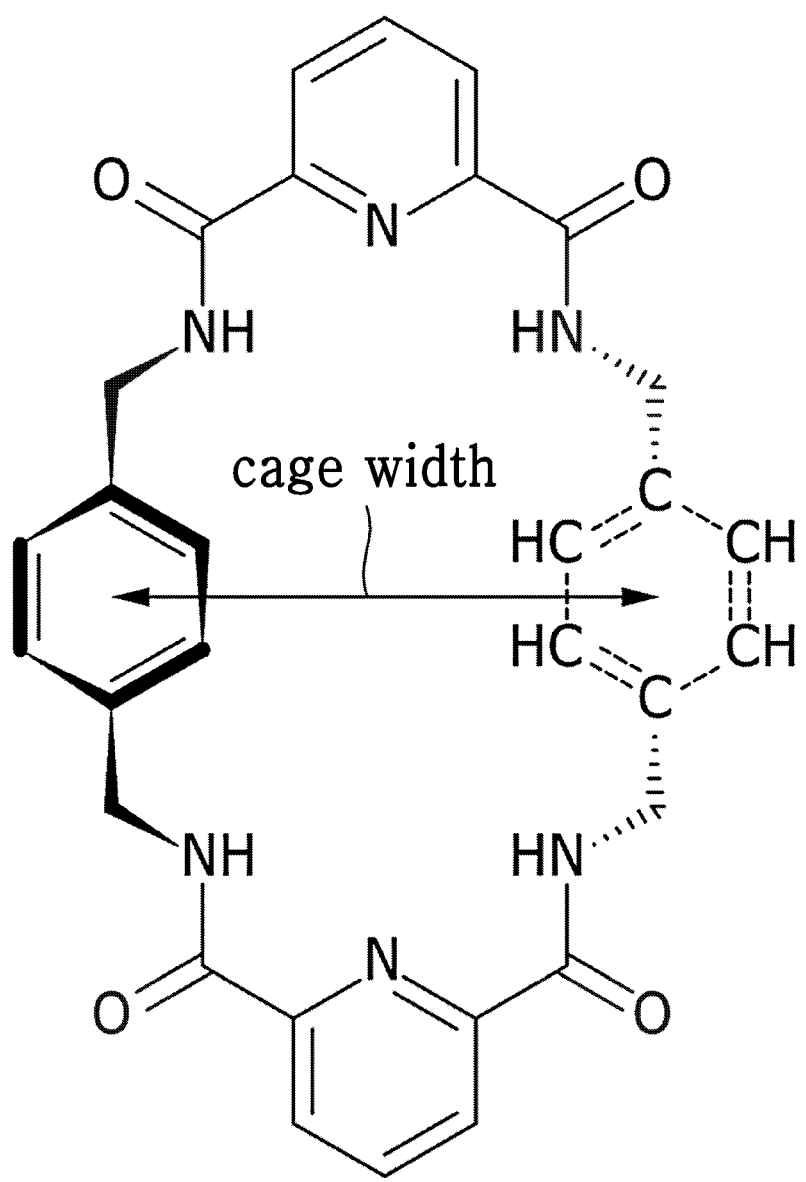

COMPOUND, PHOTOSENSITIVE RESIN COMPOSITION INCLUDING THE SAME, COLOR FILTER, AND CMOS IMAGE SENSOR

CROSS-REFERENCE TO RELATED APPLICATION

This application claims priority to and the benefit of Korean Patent Application No. 10-2021-0097266 filed in the Korean Intellectual Property Office on Jul. 23, 2021, the entire contents of which are incorporated herein by reference.

BACKGROUND

1. Field

Embodiments relate to a compound, a photosensitive resin composition including the same, a color filter manufactured using the photosensitive resin composition, and a CMOS image sensor including the color filter.

2. Description of the Related Art

With the recent rapid development of advanced information and communication processing technology and overall electronics industry, a next generation detector rapidly transmitting and receiving a large amount of information and the development of a new concept device and system have been considered. In the midst of this trend, with the recent remarkably rapid development of electronic technology, particularly, in the rapid progress of technology such as nano-size IC line widths and high performance of various semiconductor components, the development of a futuristic image sensor is proceeding in various ways. In particular, with the rise of video processing and the like in mobile devices, technology development of an ultra-down-sized and ultra-power-saving image sensor is rapidly accelerated, centering on existing CCD (Charge Coupled Device) and CMOS (Complementary Metal Oxide Semiconductor).

An image sensor, which is a semiconductor that converts photons into electrons and displays them on a display or stores them in a storage device, may include a light receiving element that converts light signals into electrical signals, a pixel circuit portion that amplifies and compresses the converted electrical signals, and an ASIC portion that converts these pre-treated analog signals into digital signals to treat image signals and for example, includes CCD, CMOS, CIS (Contact Image Sensor), or the like.

The CCD and CMOS image sensors use the same light-receiving element, but in the CCD image sensor, charges generated in the light-receiving element sequentially move through MOS capacitors connected in series and are converted into voltages in a source follower connected at the final end. On the other hand, in the CMOS image sensor, the charges are converted into voltages in a source follower built into each pixel and output to the outside. More specifically, the CCD image sensor moves electrons generated by light as they are to an output unit by using a gate pulse, but the CMOS image sensor convert the electrons generated by light into voltages in each pixel and then output them through several CMOS switches. These image sensors are very widely applied from household products such as a digital camera and a mobile phone to an endoscope used in hospitals and a telescope used in a satellite orbiting the earth.

SUMMARY

The embodiments may be realized by providing a compound represented by Chemical Formula 1:

A-L-B [Chemical Formula 1]

wherein in Chemical Formula 1, A and B are each independently a moiety having a core-shell structure, the core is represented by Chemical Formula 1-1, the shell is represented by Chemical Formula 2-1 or Chemical Formula 2-2, and L is a linking group represented by Chemical Formula 3,

[Chemical Formula 1-1]

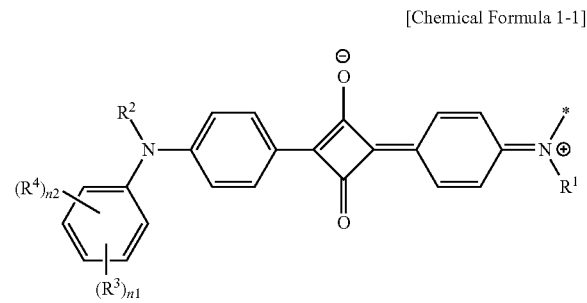

in Chemical Formula 1-1, $R^1$ to $R^4$ are each independently a halogen, a cyano group, a silane group, siloxane group, a substituted or unsubstituted epoxy group, a substituted or unsubstituted C2 to C20 alkenyl group, a substituted or unsubstituted C1 to C20 alkyl group, a substituted or unsubstituted C3 to C20 cycloalkyl group, a substituted or unsubstituted C1 to C20 alkoxy group, or a substituted or unsubstituted C6 to C20 aryl group, * is a linking point, and n1 and n2 are each independently an integer of 0 to 5, provided that 0≤n1+n2≤5,

[Chemical Formula 2-1]

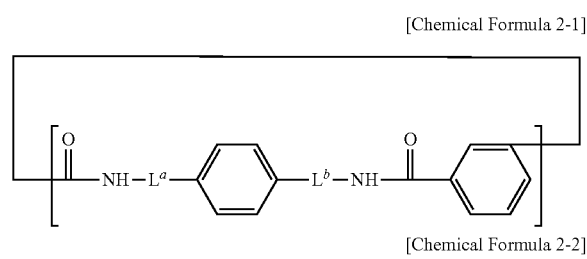

[Chemical Formula 2-2]

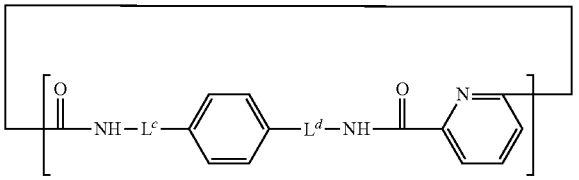

in Chemical Formula 2-1 and Chemical Formula 2-2, $L^a$ to $L^d$ are each independently a single bond or a substituted or unsubstituted C1 to C10 alkylene group,

[Chemical Formula 3]

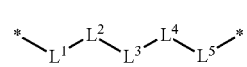

in Chemical Formula 3, $L^1$ to $L^5$ are each independently a single bond, an ether group (*—O—*), *—OC(=O)—*, *—C(=O)O—*, *—O(C=O)NH—*, *—NHC(=O)O—*, a substituted or unsubstituted C1 to C20 alkylene group, a substituted or unsubstituted C3 to C20 cycloalkylene group, a substituted or unsubstituted C6 to C20 arylene group, or a group represented by Chemical Formula L-1, and * is a linking point,

[Chemical Formula L-1]

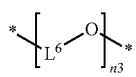

in Chemical Formula L-1, $L^6$ is a substituted or unsubstituted C1 to C10 alkylene group, * is a linking point, and n3 is an integer of 1 to 10.

The embodiments may be realized by providing a photosensitive resin composition including the compound according to an embodiment.

The embodiments may be realized by providing a color filter manufactured using the photosensitive resin composition according to an embodiment.

The embodiments may be realized by providing a CMOS image sensor including the color filter according to an embodiment.

BRIEF DESCRIPTION OF THE DRAWING

Features will be apparent to those of skill in the art by describing in detail exemplary embodiments with reference to the attached drawing in which:

The FIGURE a view showing a cage width of a shell represented by Chemical Formula 2-2-1.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

As used herein, when specific definition is not otherwise provided, "substituted" refers to replacement of at least one hydrogen of a compound by a substituent selected from a halogen atom (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, or a combination thereof.

As used herein, when specific definition is not otherwise provided, "heterocycloalkyl group", "heterocycloalkenyl group", "heterocycloalkynyl group," and "heterocycloalkylene group" refer to a cyclic group of cycloalkyl, cycloalkenyl, cycloalkynyl and cycloalkyl, respectively in which at least one heteroatom of N, O, S, or P in the ring compound is present.

As used herein, when specific definition is not otherwise provided, "(meth)acrylate" refers to both "acrylate" and "methacrylate".

As used herein, when specific definition is not otherwise provided, "combination" refers to mixing or copolymerization. In addition, "copolymerization" refers to block copolymerization or random copolymerization, and "copolymer" refers to block copolymerization or random copolymerization.

In the chemical formula of the present specification, unless a specific definition is otherwise provided, hydrogen is boned at the position when a chemical bond is not drawn where supposed to be given.

In the present specification, when specific definition is not otherwise provided, indicates a point where the same or different atom or chemical formula is linked, "*" e.g., a linking point.

In addition, as shown in the following scheme, a compound or moiety represented by Chemical Formula 1-1 according to the present specification may have three resonance structures, but herein, only one resonance structure is indicated or illustrated for convenience. The moiety represented by Chemical Formula 1-1 may be represented by any one of the following three resonance structures.

[Scheme]

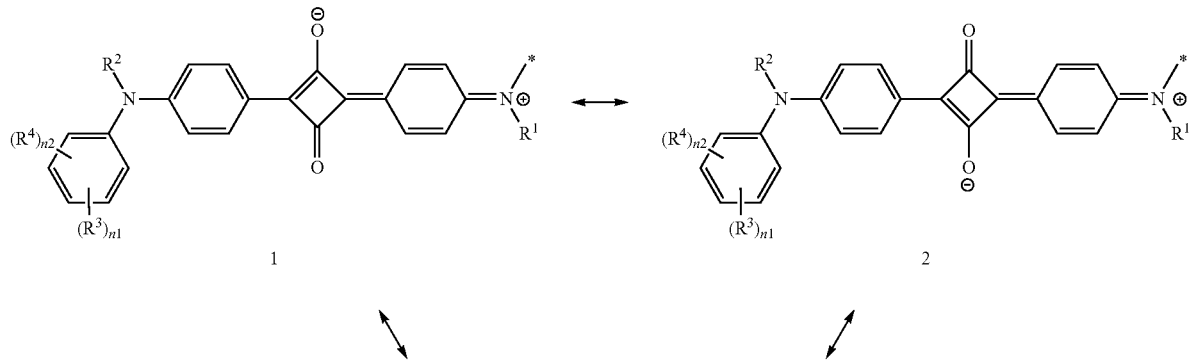

-continued

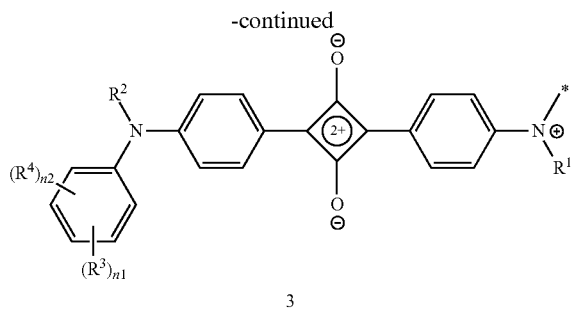

A compound according to an embodiment may be represented by, e.g., Chemical Formula 1.

A-L-B [Chemical Formula 1]

In Chemical Formula 1, A and B may each independently be, e.g., a compound or moiety consisting of or having a core-shell structure.

In an implementation, the core may be represented by, e.g., Chemical Formula 1-1.

In an implementation, the shell may be represented by, e.g., Chemical Formula 2-1 or Chemical Formula 2-2.

In an implementation, L may be represented by, e.g., Chemical Formula 3.

[Chemical Formula 1-1]

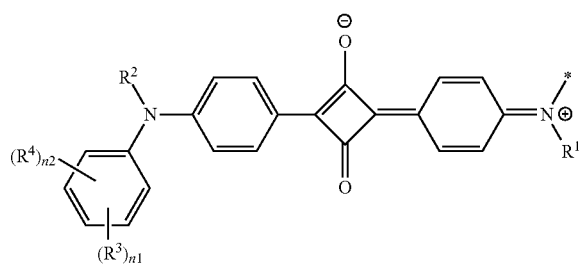

In Chemical Formula 1-1, $R^1$ to $R^4$ may each independently be or include, e.g., a halogen, a cyano group, a silane group, siloxane group, a substituted or unsubstituted epoxy group, a substituted or unsubstituted C2 to C20 alkenyl group, a substituted or unsubstituted C1 to C20 alkyl group, a substituted or unsubstituted C3 to C20 cycloalkyl group, a substituted or unsubstituted C1 to C20 alkoxy group, or a substituted or unsubstituted C6 to C20 aryl group. As used herein, the term "or" is not an exclusive term, e.g., "A or B" would include A, B, or A and B.

n1 and n2 may each independently be, e.g., an integer of 0 to 5, provided that 0≤n1+n2≤5.

* is a linking point.

[Chemical Formula 2-1]

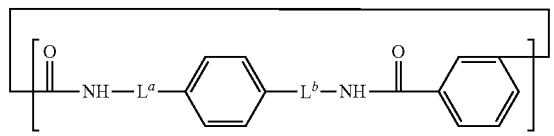

[Chemical Formula 2-2]

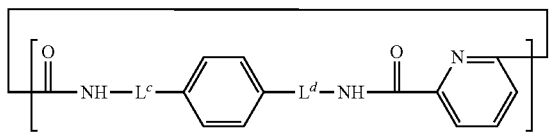

In Chemical Formula 2-1 and Chemical Formula 2-2, $L^a$ to $L^d$ may each independently be or include, e.g., a single bond or a substituted or unsubstituted C1 to C10 alkylene group. In Chemical Formula 2-1 and Chemical Formula 2-2, the bracketed portions may be repeated, e.g., at least two times, in order to provide the shell structure.

[Chemical Formula 3]

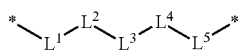

In Chemical Formula 3, $L^1$ to $L^5$ may each independently be or include, e.g., a single bond, an ether group (*—O—*), *—OC(=O)—*, *—C(=O)O—*, *—O(C=O)NH—*, *—NHC(=O)O—*, a substituted or unsubstituted C1 to C20 alkylene group, a substituted or unsubstituted C3 to C20 cycloalkylene group, a substituted or unsubstituted C6 to C20 arylene group, or a group represented by Chemical Formula L-1.

[Chemical Formula L-1]

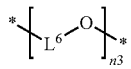

In Chemical Formula L-1, $L^6$ may be or may include, e.g., a substituted or unsubstituted C1 to C10 alkylene group.

n3 may be an integer of, e.g., 1 to 10.

The present disclosure relates to the synthesis of a modified squarene dye, which may be a green dye included in a color filter in a CMOS image sensor. As the pixels become smaller, there may be a limit to manufacture a fine pattern by using a pigment, and accordingly, a dye may compensating for this. Some dyes may have issues in terms of processibility during the pattern manufacture, compared with the pigment. The pigment may have poor solubility due to crystallinity and thus may not be eluted in a solvent such as PGMEA after the baking, and the dye may be an amorphous solid and thus dissolved in the solvent after the baking. A CMOS image sensor may include a color material in a high content and thus a binder or a monomer may be used therewith in a relatively low content, and chemical resistance of the dye could be difficult to increase. In addition, as the content of the color material is increased, heat resistance of the color material may also be important.

Accordingly, a dye may structurally have excellent chemical resistance and heat resistance. One or more embodiments may provide a dye maintaining chemical resistance and simultaneously, having improved heat resistance even after the curing and thermal processes by modifying a squarene dye represented by Chemical Formula 1.

The compound represented by Chemical Formula 1 may have excellent green spectral properties and a high molar extinction coefficient and may be used as a green dye. During the baking after used to prepare a color resist, chemical resistance and heat resistance of the compound could be deteriorated, e.g., due to durability issues compared to that of the pigment, thereby deteriorating luminance. In the compound according to an embodiment, the terminal end of the squarene dye may be modified, and a core-shell (e.g., a rotaxane shell) structure having the squarene dye as a core synthesized and additionally modified into a dimer form to simultaneously improve heat resistance and durability, realizing a color filter with high luminance and a high contrast ratio.

In an implementation, in Chemical Formula 1, when A (or B) and L are connected to a cycloalkylene group or an arylene group, the A (or B) and L may be connected to an ortho position, a meta position, or a para position based on the cycloalkylene group or the arylene group. In an implementation, when connected to the para position, chemical resistance and durability, may be improved.

In an implementation, in Chemical Formula 1, at least one of $R^2$ to $R^4$ may include a (meth)acrylate group at a terminal end thereof (e.g., pendent). In this case, the chemical resistance of the compound according to the embodiment may be greatly improved.

In the compound according to an embodiment, A and B may be bonded to each other through a linker (L). A and B may each independently have a core-shell structure, the shell may be a macrocyclic compound, and the shell may form a coating layer while surrounding the core. In an implementation, the chemical resistance and heat resistance of the compound itself may be greatly improved by presenting in the form of a dimer as in Chemical Formula 1, rather than when A and B each exist alone.

In an implementation, the structure that the shell corresponding to a macrocyclic compound may surround the core, e.g., the core may exist inside the macrocyclic ring, and chemical resistance and heat resistance of the core-shell compound may be improved, thereby realizing a color filter with high luminance and a high contrast ratio. In an implementation, the compound represented by Chemical Formula 1 may have the dimer form centering on L. If the cores constituting the structures A and B at both sides of L were not respectively surrounded with the shell, the compound itself could be structurally very unstable and easily decomposed. In an implementation, the A and B may each have a core-shell structure.

In an implementation, the moiety (e.g., functional group) represented by Chemical Formula 1-1, of the core, may have a length of about 1 nm to about 3 nm, e.g., about 1.5 nm to about 2 nm. When the moiety represented by Chemical Formula 1-1 has a length within the ranges, the core-shell structure may be easily formed. In an implementation, the moiety represented by Chemical Formula 1-1 may have a length within the range, and the shell, which is the macrocyclic compound, may easily surround the moiety represented by Chemical Formula 1-1. If another moiety were to have a length out of the range and used as the core, it could difficult for the shell to surround the core, and improvement of chemical resistance and heat resistance may hardly be expected.

The moiety represented by Chemical Formula 1-1 (constituting the core) may have a maximum absorption peak at a wavelength of about 530 nm to about 680 nm. A core-shell compound including the moiety represented by Chemical Formula 1-1 and having the spectral properties may be used as a core, e.g., as a green dye to prepare a photosensitive resin composition for a color filter having high luminance and a high contrast ratio.

In an implementation, in Chemical Formula 3, $L^1$ and $L^5$ may each independently be, e.g., a substituted or unsubstituted C6 to C20 arylene group, and in Chemical Formula 1-1, $R^1$ may be, e.g., a halogen, a cyano group, a silane group, siloxane group, a substituted or unsubstituted epoxy group, a substituted or unsubstituted C2 to C20 alkenyl group, a substituted or unsubstituted C1 to C20 alkyl group, a substituted or unsubstituted C3 to C20 cycloalkyl group, or a substituted or unsubstituted C1 to C20 alkoxy group.

In an implementation, in Chemical Formula 3, $L^1$ and $L^5$ may each independently be, e.g., a substituted or unsubstituted C3 to C20 cycloalkylene group, and in Chemical Formula 1-1, $R^1$ may be, e.g., a halogen, a cyano group, a silane group, siloxane group, a substituted or unsubstituted epoxy group, a substituted or unsubstituted C2 to C20 alkenyl group, a substituted or unsubstituted C1 to C20 alkyl group, a substituted or unsubstituted C1 to C20 alkoxy group, or a substituted or unsubstituted C6 to C20 aryl group.

In an implementation, in Chemical Formula 1-1 and Chemical Formula 3, when the definitions of $L^1$, $L^5$, and $R^1$ are the same as described above, in Chemical Formula 3, $L^2$ and $L^4$ may each independently be, e.g., a single bond, an ether group (*—O—*), *—OC(=O)—*, *—C(=O)O—*, *—O(C=O)NH—*, *—NHC(=O)O—* or a group represented by Chemical Formula L-1.

In an implementation, in Chemical Formula 1-1 and Chemical Formula 3, when the definitions of $L^1$, $L^5$, and $R^1$ are the same as described above, in Chemical Formula 3, $L^5$ may be, e.g., a single bond, a substituted or unsubstituted C1 to C20 alkylene group, or a group represented by Chemical Formula L-1.

In an implementation, in Chemical Formula 2-1 and Chemical Formula 2-2, $L^a$ to $L^d$ may each independently be, e.g., a substituted or unsubstituted C1 to C10 alkylene group. In this case, the solubility may be improved, and a structure in which the shell surrounds the core including the moiety represented by Chemical Formula 1-1 may be easily formed.

In an implementation, in Chemical Formula 1, A and B may each independently include a non-covalent bond, e.g., a hydrogen bond between an oxygen atom of the moiety represented by Chemical Formula 1-1 and a hydrogen atom forming a bond with a nitrogen atom of the shell represented by Chemical Formula 2-1 or Chemical Formula 2-2.

In an implementation, the shell may be represented by, e.g., Chemical Formula 2-1-1 or Chemical Formula 2-2-1.

[Chemical Formula 2-1-1]

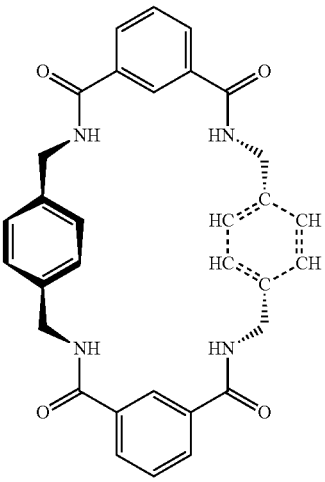

[Chemical Formula 2-2-1]

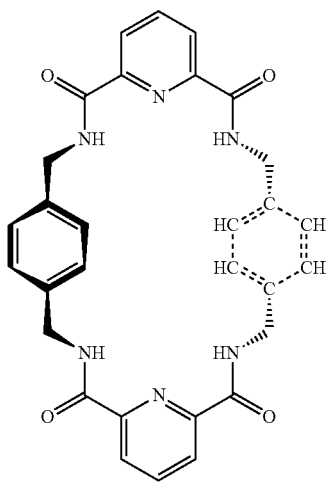

In an implementation, the shell may have, e.g., a cage width of about 6.5 Å to about 7.5 Å. In an implementation, the shell may have, e.g., a volume of about 10 Å to about 16 Å. The cage width in this disclosure refers to an internal distance of the shell, e.g., in a shell represented by Chemical Formula 2-1-1 or Chemical Formula 2-2-1, a distance between two different phenylene groups in which both methylene groups are linked (See the FIGURE). When the shell has a cage width within the above range, a core-shell compound having a structure surrounding the core including the moiety represented by Chemical Formula 1-1 may be obtained, and accordingly, when the core-shell compound is added to the photosensitive resin composition as a dye, realizing a color filter having excellent chemical resistance and heat resistance and high luminance.

The core-shell compound may be a compound in which a core including the moiety represented by Chemical Formula 1-1 and the shell are included in a mole ratio of 1:1. When the core and the shell are present in the mole ratio, a coating layer (shell) surrounding the core including the moiety represented by Chemical Formula 1-1 may be well formed.

In an implementation, when the compound represented by Chemical Formula 1 is used in a photosensitive resin composition (e.g., as a dye), the solubility in a solvent (to be described below) may be greater than or equal to about 5, e.g., about 5 to about 10. The solubility may be obtained by an amount (g) of the dye (compound) dissolved in 100 g of the solvent. When the compound (e.g., dye) has solubility within the range, compatibility and coloring properties with other components in the photosensitive resin composition, e.g., post-described binder resin, photopolymerizable monomer, and photopolymerization initiator may be secured, and precipitation of the dye may be prevented.

The compound represented by Chemical Formula 1 may have excellent heat resistance. In an implementation, when measured with a thermogravimetric analyzer (TGA), the thermal decomposition temperature may be 200° C. or higher, e.g., 200° C. to 300° C.

In an implementation, the compound represented by Chemical Formula 1 may be represented by, e.g., one of Chemical Formula A-1 to Chemical Formula E-1.

[Chemical Formula A-1]

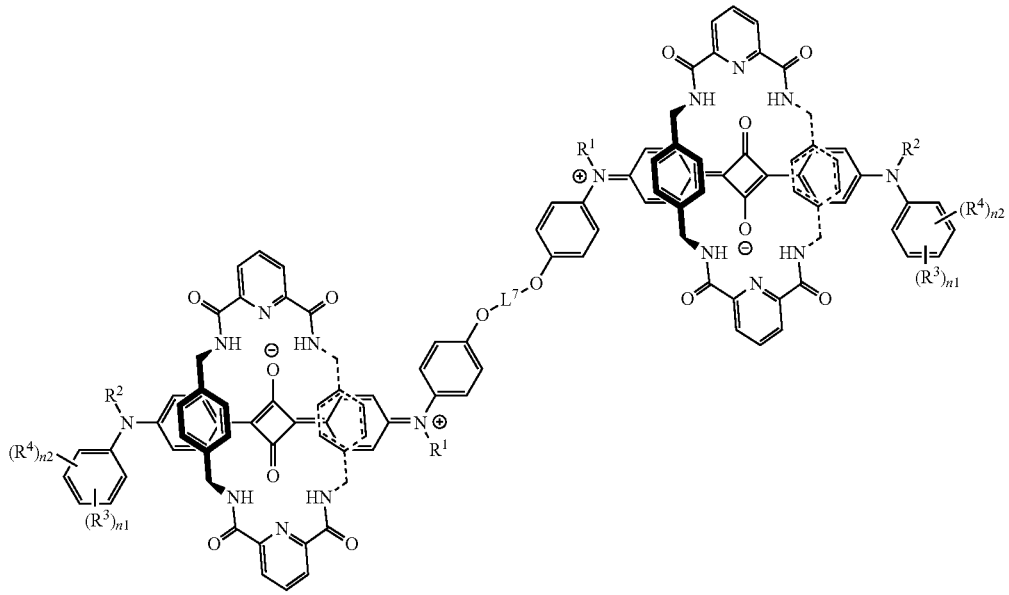

-continued
[Chemical Formula A-2]
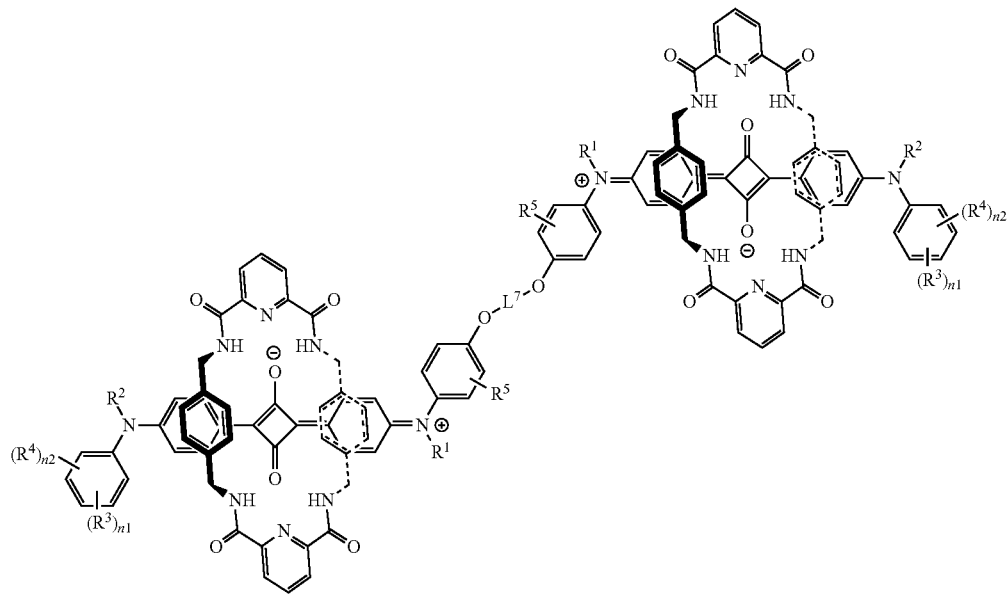
[Chemical Formula A-3]
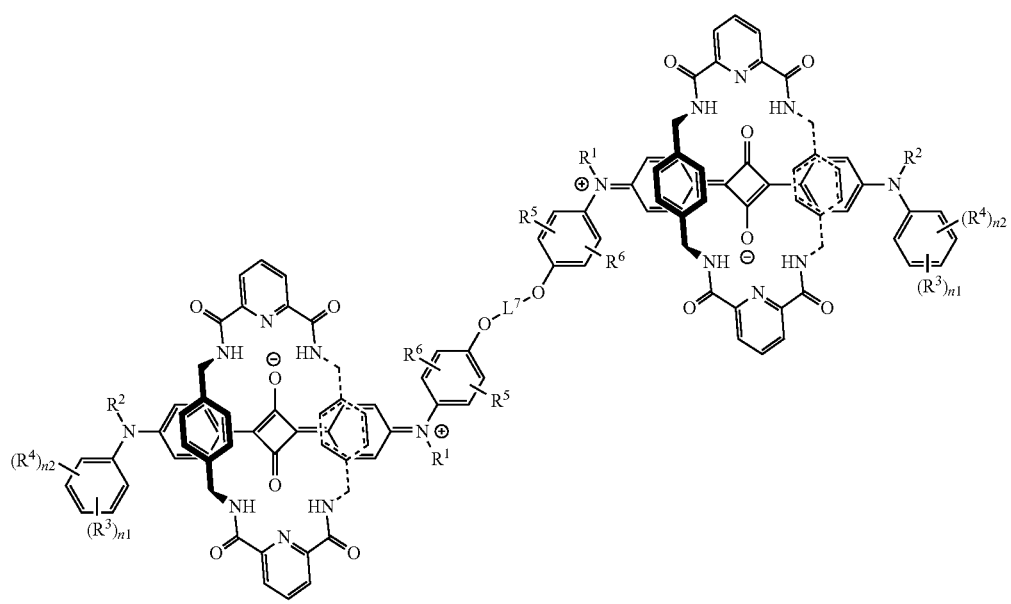

[Chemical Formula B-1]
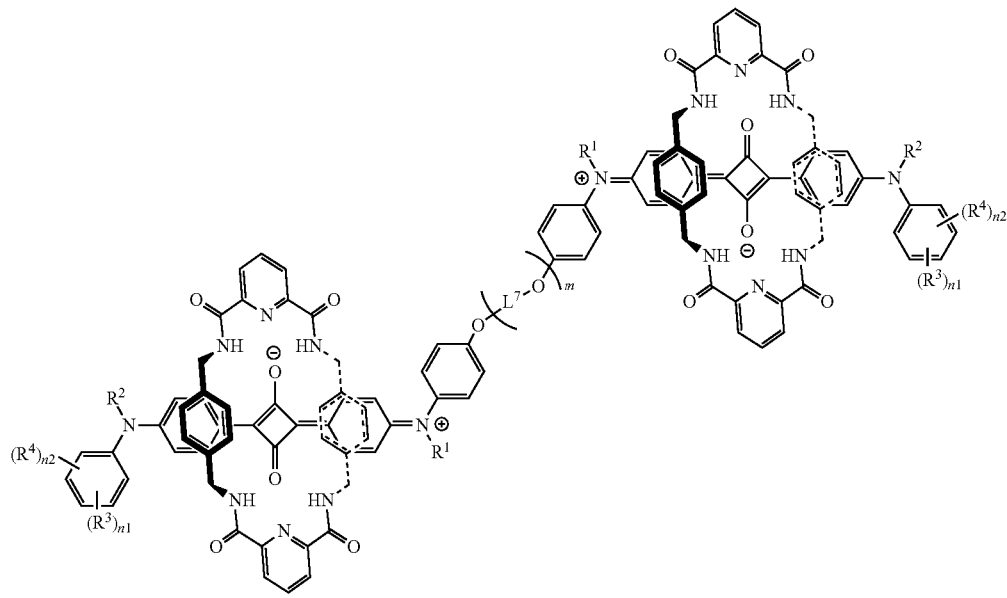
[Chemical Formula B-2]
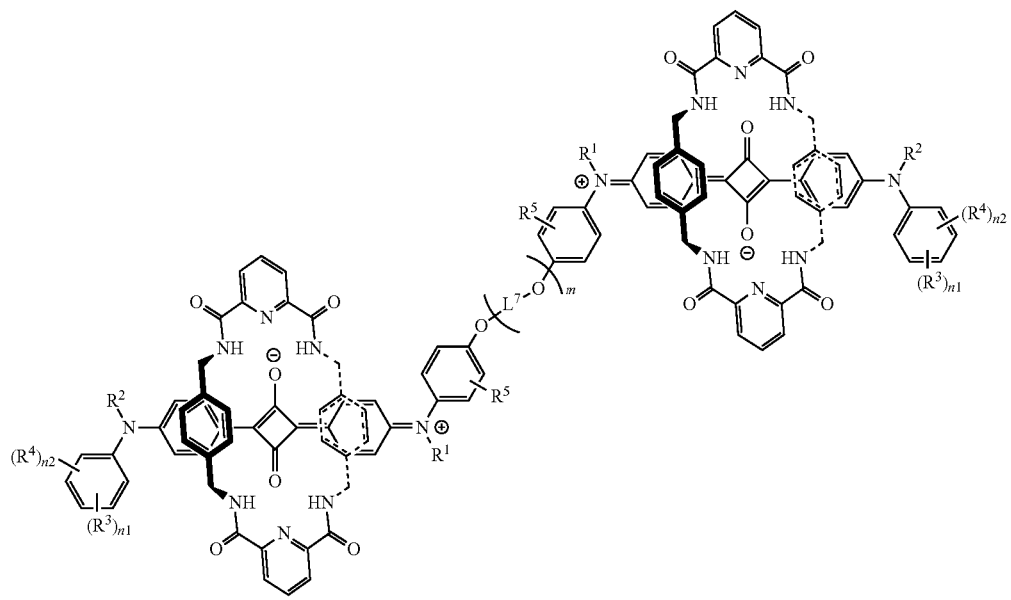

[Chemical Formula B-3]
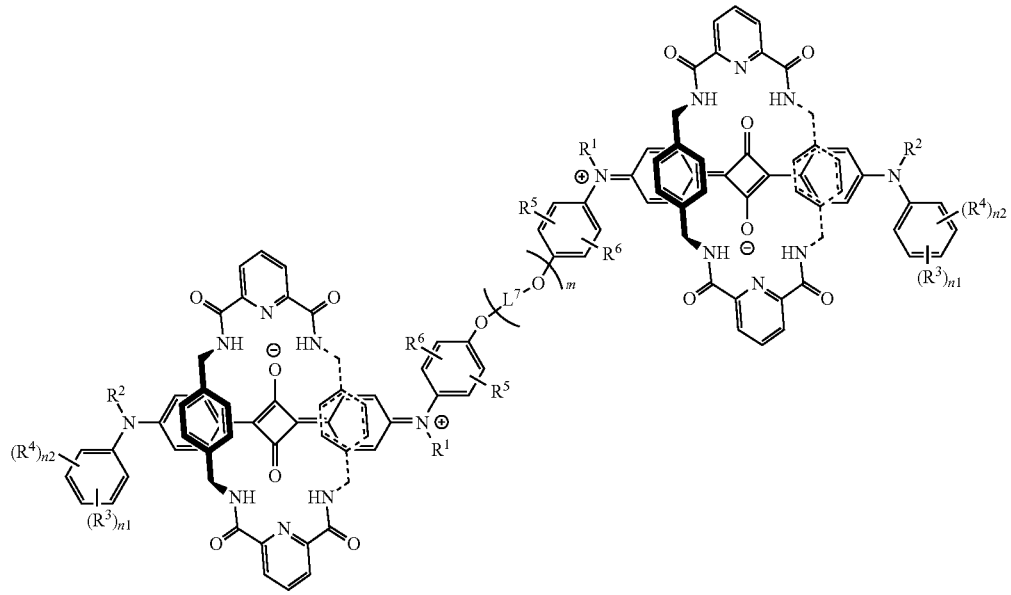
[Chemical Formula C-1]
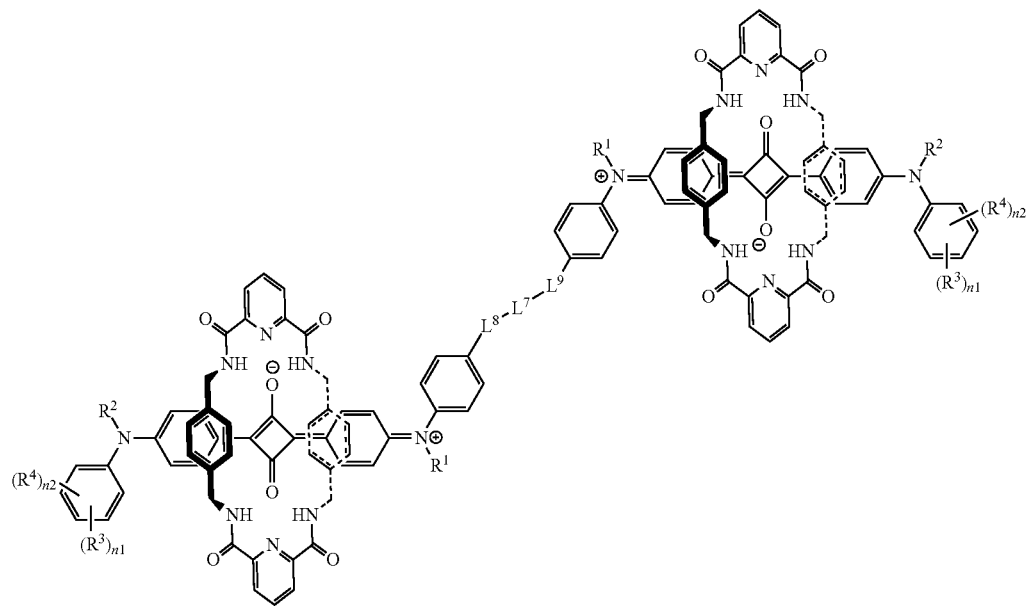

[Chemical Formula C-2]
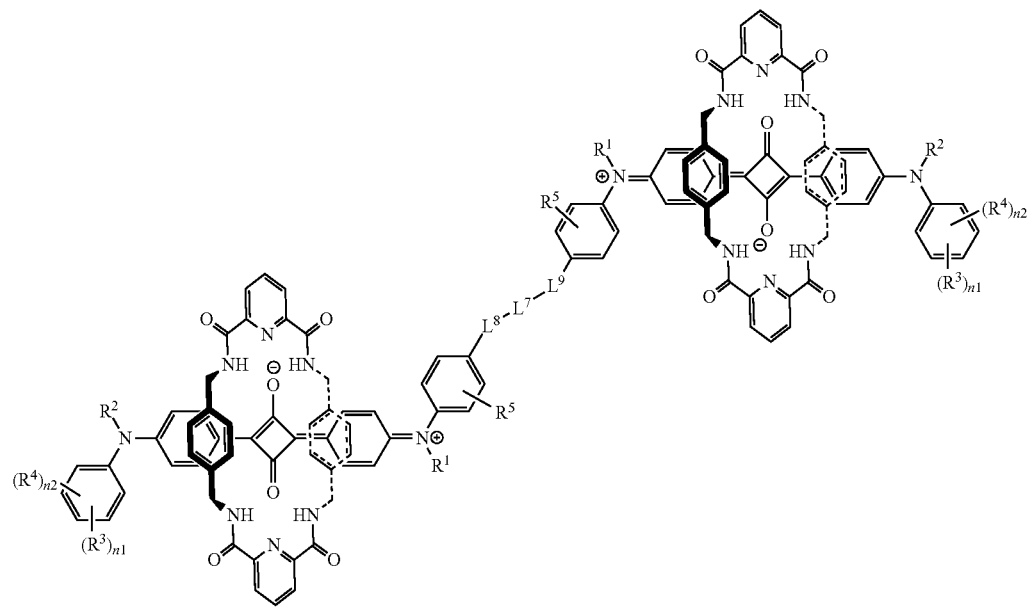
[Chemical Formula C-3]
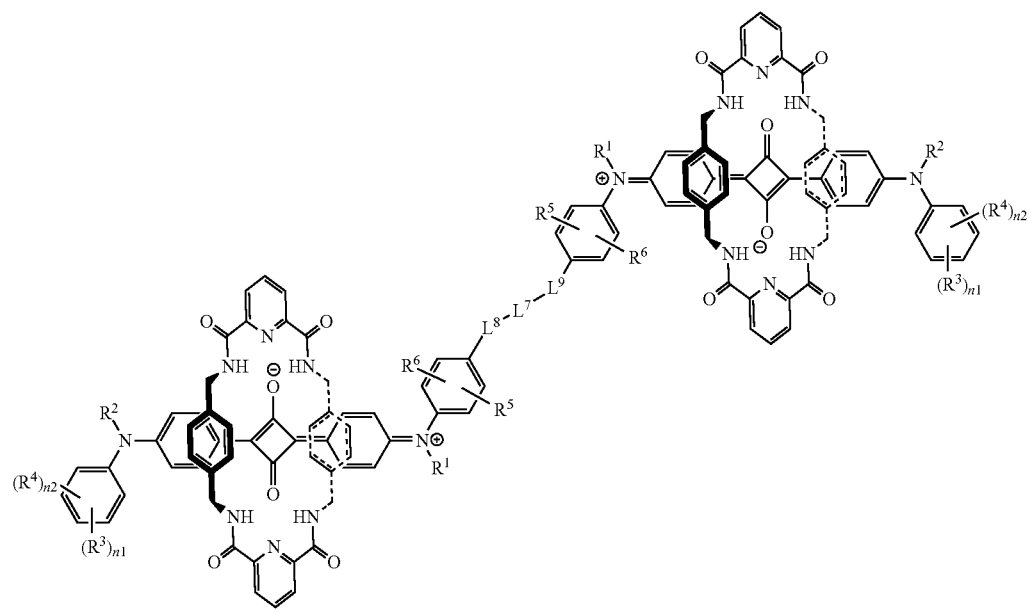

[Chemical Formula D-1]
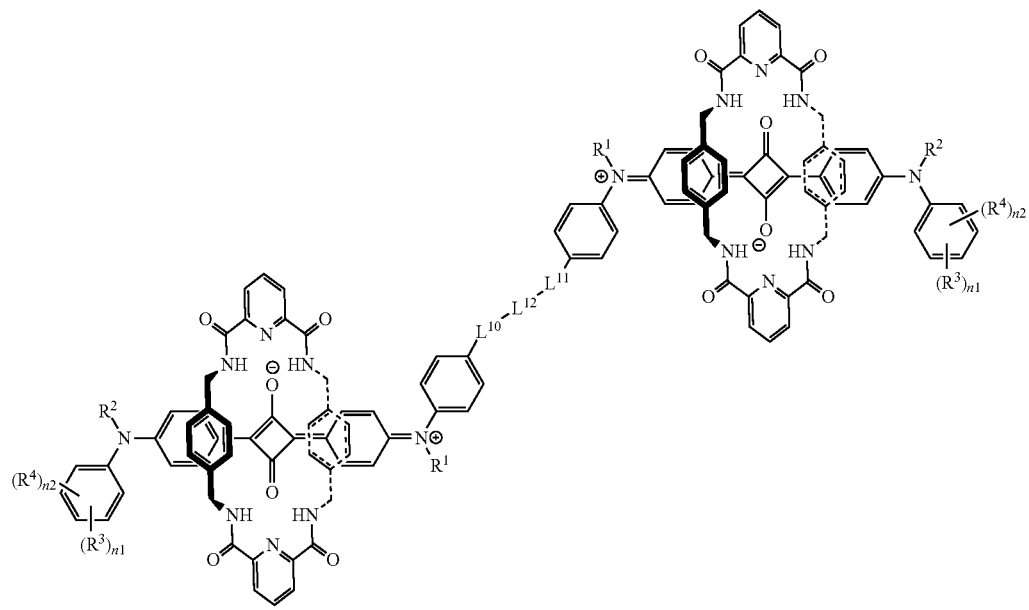
[Chemical Formula D-2]
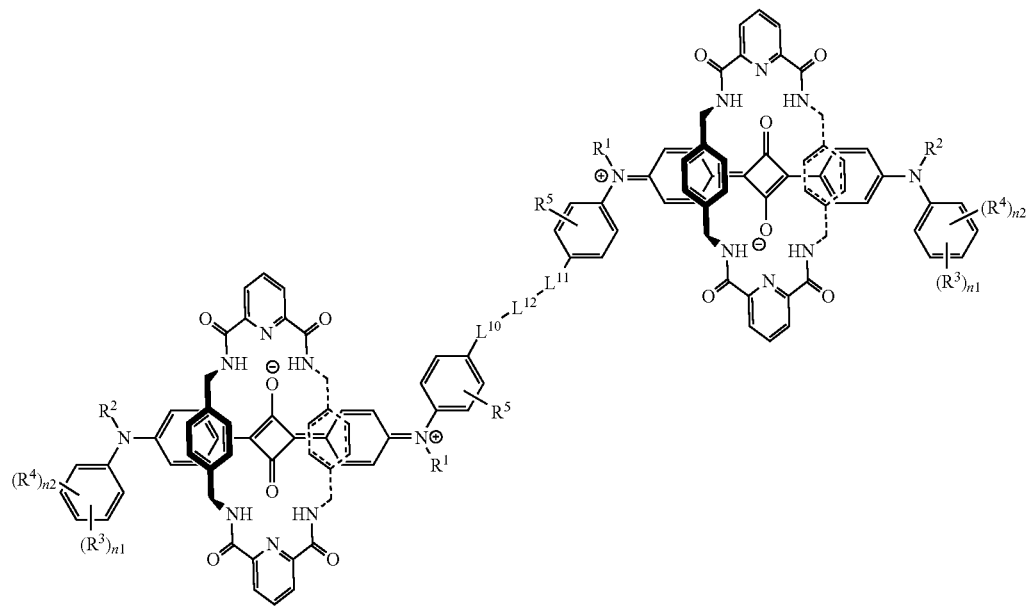

[Chemical Formula D-3]

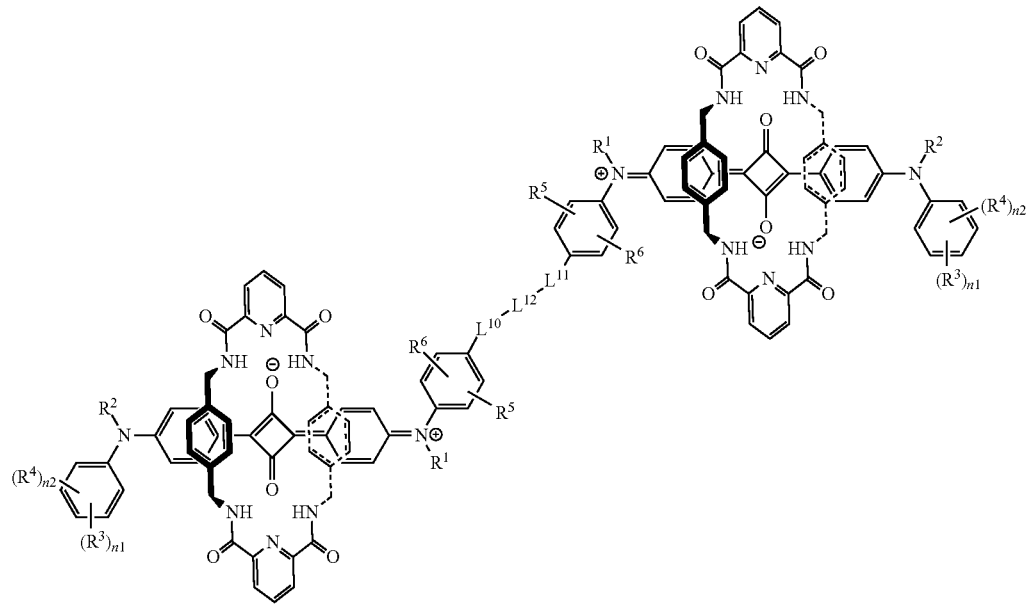

[Chemical Formula E-1]

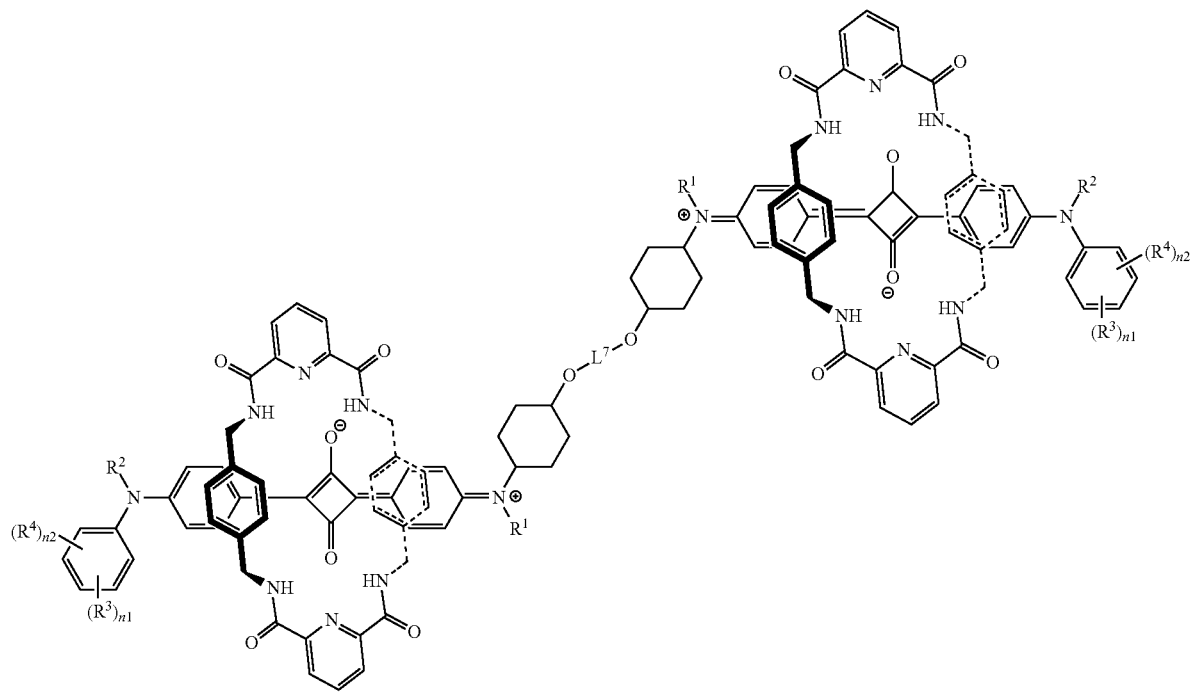

In Chemical Formula A-1 to Chemical Formula E-1; $R^1$ to $R^4$ may each independently be or include, e.g., a halogen, a cyano group, a silane group, siloxane group, a substituted or unsubstituted epoxy group, a substituted or unsubstituted C2 to C20 alkenyl group, a substituted or unsubstituted C1 to C20 alkyl group, a substituted or unsubstituted C3 to C20 cycloalkyl group, a substituted or unsubstituted C1 to C20 alkoxy group, or a substituted or unsubstituted C6 to C20 aryl group.

$R^5$ and $R^6$ may each independently be or include, e.g., a substituted or unsubstituted C1 to C20 alkyl group.

$L^7$ may be or may include, e.g., a substituted or unsubstituted C1 to C20 alkylene group.

$L^8$ and $L^9$ may each independently be, e.g., *—OC(=O)—* or *—C(=O)O—*.

$L^{10}$ and $L^{11}$ may each independently be, e.g., *—O(C=O)NH—* or *—NHC(=O)O—*.

$L^{12}$ may be or may include, e.g., a substituted or unsubstituted C1 to C20 alkylene group or a substituted or unsubstituted C3 to C20 cycloalkylene group.

n1 and n2 may each independently be, e.g., an integer of 0 to 5, provided that $0 \le n1+n2 \le 5$.

m may be, e.g., an integer of 2 to 20.

The compound represented by Chemical Formula 1 may be used alone as a green dye and may be mixed with an auxiliary dye.

The auxiliary dye may include, e.g., a triarylmethane dye, an anthraquinone dye, a benzylidene dye, a cyanine dye, phthalocyanine dye, an azaporphyrin dye, an indigo dye, a xanthene dye, or the like.

The compound represented by Chemical Formula 1 may also be used in combination with a pigment.

The pigment may include, e.g., a red pigment, a green pigment, a blue pigment, a yellow pigment, a black pigment, or the like.

Examples of the red pigment may include C.I. red pigment 254, C.I. red pigment 255, C.I. red pigment 264, C.I. red pigment 270, C.I. red pigment 272, C.I. red pigment 177, C.I. red pigment 89, and the like. Examples of the green pigment may include C.I. green pigment 36, C.I. green pigment 7, C.I. green pigment 58, and the like. Examples of the blue pigment may include a copper phthalocyanine pigment such as C.I. blue pigment 15:6, C.I. blue pigment 15, C.I. blue pigment 15:1, C.I. blue pigment 15:2, C.I. blue pigment 15:3, C.I. blue pigment 15:4, C.I. blue pigment 15:5, C.I. blue pigment 16, and the like. Examples of the yellow pigment may include an isoindoline pigment such as C.I. yellow pigment 139, and the like, a quinophthalone pigment such as C.I. yellow pigment 138, and the like, a nickel complex pigment such as C.I. yellow pigment 150, and the like. Examples of the black pigment may include aniline black, perylene black, titanium black, carbon black, and the like. The pigment may be used alone or as a mixture of two or more.

The pigment may be included in the photosensitive resin composition for a color filter in a pigment dispersion state. The pigment dispersion liquid may include or consist of the pigment and a solvent, a dispersant, a dispersion resin, or the like.

The solvent may include, e.g., ethylene glycol acetate, ethyl cellosolve, propylene glycol methyl ether acetate, ethyl lactate, polyethylene glycol, cyclohexanone, propylene glycol methyl ether, or the like. In an implementation, the solvent may include, e.g., propylene glycol methyl ether acetate.

The dispersant may facilitate uniform dispersion of the pigment, and may include a non-ionic, anionic, or cationic dispersing agent. Examples of the dispersant may include polyalkylene glycol or esters thereof, polyoxy alkylene, polyhydric alcohol ester alkylene oxide adducts, alcohol alkylene oxide addition products, sulfonate esters, sulfonate salts, carboxylate esters, carboxylate salts, alkyl amide alkylene oxide adducts, alkyl amines, and may be used alone or as a mixture of two or more.

The dispersion resin may include an acryl resin including a carboxyl group, and may help improve stability of the pigment dispersion liquid and pattern properties of a pixel.

When the compound represented by Chemical Formula 1 and the pigment are mixed and used, the compound represented by Chemical Formula 1 and the pigment may be used in a weight ratio of 1:9 to 9:1, e.g., 3:7 to 7:3. When they are mixed within the weight ratio range, high luminance and contrast ratios may be obtained while color characteristics are maintained.

According to another embodiment, a photosensitive resin composition including the compound represented by Chemical Formula 1 is provided.

The photosensitive resin composition may include, e.g., (A) a colorant (the compound represented by Chemical Formula 1), (B) a binder resin, (C) a photopolymerizable monomer, (D) a photopolymerization initiator, and (E) a solvent.

Hereinafter, each component is described in detail.

(A) Colorant

The colorant may include a compound represented by Chemical Formula 1, and the compound represented by Chemical Formula 1 has been described above.

In an implementation, the colorant may further include a pigment in addition to the compound represented by Chemical Formula 1, and the pigment has been described above.

The compound represented by Chemical Formula 1 may be included in an amount of about 0.5 wt % to about 10 wt %, e.g., about 0.5 wt % to about 5 wt %, based on the total weight of the photosensitive resin composition. When the core-shell dye is used within the range, high luminance and a high contrast ratio at a desirable color coordinate may be realized.

(B) Binder Resin

The binder resin may include a copolymer of a first ethylenic unsaturated monomer and a second ethylenic unsaturated monomer that is copolymerizable therewith, and may be a resin including at least one acrylic repeating unit.

The first ethylenic unsaturated monomer may include an ethylenic unsaturated monomer including at least one carboxyl group and examples of the monomer may include acrylic acid, methacrylic acid, maleic acid, itaconic acid, fumaric acid, a combination thereof.

The first ethylenic unsaturated monomer may be included in an amount of about 5 wt % to about 50 wt %, e.g., about 10 wt % to about 40 wt %, based on the total weight of the alkali soluble resin.

The second ethylenic unsaturated monomer may include an aromatic vinyl compound such as styrene, α-methylstyrene, vinyl toluene, vinylbenzylmethylether and the like; an unsaturated carboxylate ester compound such as methyl (meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; an unsaturated amino alkyl carboxylate ester compound such as 2-aminoethyl(meth)acrylate, 2-dimethylaminoethyl(meth)acrylate, and the like; a carboxylic acid vinyl ester compound such as vinyl acetate, vinyl benzoate, and the like; an unsaturated glycidyl carboxylate ester compound such as glycidyl (meth)acrylate, and the like; a vinyl cyanide compound such as (meth) acrylonitrile and the like; an unsaturated amide compound such as (meth)acrylamide, and the like; and may be used alone or as a mixture of two or more.

Examples of the binder resin may include a methacrylic acid/benzylmethacrylate copolymer, a methacrylic acid/benzylmethacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer and the like, and these may be used alone or as a mixture of two or more.

A weight average molecular weight of the binder resin may be about 3,000 g/mol to about 150,000 g/mol, e.g., about 5,000 g/mol to about 50,000 g/mol, or about 20,000 g/mol to about 30,000 g/mol. When the weight average molecular weight of the binder resin is within the above range, close-contacting properties with a substrate are improved, the physical and chemical properties are good, and the viscosity is appropriate.

An acid value of the binder resin may be about 15 mgKOH/g to about 60 mgKOH/g, e.g., about 20 mgKOH/g to about 50 mgKOH/g. When the acid value of the binder resin is within the above range, excellent pixel resolution may be obtained.

The binder resin may be included in an amount of about 0.1 wt % to about 30 wt %, e.g., about 5 wt % to about 20 wt %, based on the total weight of the photosensitive resin composition. When the binder resin is included within the range, the composition may have an excellent developability and improved crosslinking, and thus has excellent surface flatness when manufactured into a color filter.

(C) Photopolymerizable Monomer

The photopolymerizable monomer may include a mono-functional or multi-functional ester of (meth)acrylic acid including at least one ethylenic unsaturated double bond.

The photopolymerizable monomer has the ethylenic unsaturated double bond and thus, may cause sufficient polymerization during exposure in a pattern-forming process and form a pattern having excellent heat resistance, light resistance, and chemical resistance.

Examples of the photopolymerizable monomer may include ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy (meth)acrylate, and the like.

Commercially available examples of the photopolymerizable monomer may be as follows. The mono-functional (meth)acrylic acid ester may include Aronix M-101®, M-111®, M-114® (Toagosei Chemistry Industry Co., Ltd.); KAYARAD TC-110S®, TC-120S® (Nippon Kayaku Co., Ltd.); V-158®, V-2311® (Osaka Organic Chemical Ind., Ltd.), and the like. Examples of a difunctional (meth)acrylic acid ester may include Aronix M-210®, M-240®, M-6200® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), and the like. Examples of a tri-functional (meth)acrylic acid ester may include Aronix M-309®, M-400®, M-405®, M-450®, M-7100®, M-8030®, M-8060®, and the like of Toagosei Chemistry Industry Co., Ltd.; KAYARAD TMPTA®, DPCA-20®, DPCA-30®, DPCA-60®, DPCA-120® of Nippon Kayaku Co., Ltd., V-295®, V-300®, V-360®, V-GPT®, V-3PAR, V-400® of Osaka Yuki Kayaku Kogyo Co. Ltd., and the like. These may be used alone or as a mixture of two or more.

The photopolymerizable monomer may be treated with acid anhydride to improve developability.

The photopolymerizable monomer may be included in an amount of about 0.1 wt % to about 30 wt %, e.g., about 5 wt % to about 20 wt %, based on the total weight of the photosensitive resin composition. When the photopolymerizable monomer is included within the range, pattern characteristics and developability are improved when manufacturing color filters.

(D) Photopolymerization Initiator

The photopolymerization initiator may include, e.g., an acetophenone compound, a benzophenone compound, a thioxanthone compound, a benzoin compound, a triazine compound, an oxime compound, or the like.

Examples of the acetophenone compound may include 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone compound may include benzophenone, benzoyl benzoate, benzoyl methyl benzoate, 4-phenyl benzophenone, hydroxy benzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone compound may include thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin compound may include benzoin, benzoin methyl ether, benzoin ethyl ether, benzoin isopropyl ether, benzoin isobutyl ether, benzyldimethylketal, and the like.

Examples of the triazine compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloromethyl)-s-triazine, bis(trichloromethyl)-6-styryl-s-triazine, 2-(naphthol-yl)-4,6-bis(trichloromethyl)-s-triazine, 2-(4-methoxynaphtho1-yl)-4,6-bis(trichloromethyl)-s-triazine, 2-4-trichloromethyl (piperonyl)-6-triazine, 2-4-trichloromethyl(4'-methoxystyryl)-6-triazine, and the like.

Examples of the oxime compound may include 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethenone, and the like.

The photopolymerization initiator may further include a carbazole compound, a diketone compound, a sulfonium borate compound, a diazo compound, an imidazole compound, a biimidazole compound, or the like.

The photopolymerization initiator may be included in an amount of about 0.1 wt % to about 5 wt %, e.g., about 1 wt % to about 3 wt %, based on the total weight of the photosensitive resin composition. When the photopolymerization initiator is included within the range, the composition may be sufficiently photopolymerized when exposed to light during the pattern-forming process for preparing a color filter, accomplishing excellent sensitivity and improving transmittance.

(E) Solvent

The solvent may be a suitable solvent. In an implementation, the solvent may include, e.g., alcohols such as methanol, ethanol, or the like; ethers such as dichloroethyl ether, n-butyl ether, diisoamyl ether, methylphenyl ether, tetrahydrofuran, or the like; glycol ethers such as ethylene glycol methylether, ethylene glycol ethylether, propylene glycol methylether, or the like; cellosolve acetates such as methyl cellosolve acetate, ethyl cellosolve acetate, diethyl cellosolve acetate, or the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, or the like; propylene glycol alkylether acetates such as propylene glycol methylether acetate, propylene glycol propylether acetate, or the like; aromatic hydrocarbons such as toluene, xylene, or the like; ketones such as methylethylketone, cyclohexanone, 4-hydroxy-4-methyl-2-pentanone, methyl-n-propylketone, methyl-n-butylketone, methyl-n-amylketone, 2-heptanone, or the like; saturated aliphatic monocarboxylic acid alkyl esters such as ethyl acetate, n-butyl acetate, isobutyl acetate, or the like; alkyl lactate esters such as methyl lactate, ethyl lactate, or the like; alkyl hydroxyacetate esters such as methyl hydroxyacetate, ethyl hydroxyacetate, butyl hydroxyacetate, or the like; alkoxyalkyl acetate esters such as methoxymethyl acetate, methoxyethyl acetate, methoxybutyl acetate, ethoxymethyl acetate, ethoxyethyl acetate, or the like; 3-hydroxypropionic acid alkyl esters such as methyl 3-hydroxypropionate, ethyl 3-hydroxypropionate, or the like;

3-alkoxypropionic acid alkyl esters such as methyl 3-methoxypropionate, ethyl 3-methoxypropionate, ethyl 3-ethoxypropionate, methyl 3-ethoxypropionate, or the like; 2-hydroxypropionic acid alkyl esters such as methyl 2-hydroxypropionate, ethyl 2-hydroxypropionate, propyl 2-hydroxypropionate, or the like; 2-alkoxypropionic acid alkyl esters such as methyl 2-methoxypropionate, ethyl 2-methoxypropionate, ethyl 2-ethoxypropionate, methyl 2-ethoxypropionate, or the like; 2-hydroxy-2-methylpropionic acid alkyl esters such as methyl 2-hydroxy-2-methylpropionate, ethyl 2-hydroxy-2-methylpropionate, or the like; 2-alkoxy-2-methylpropionic acid alkyl esters such as methyl 2-methoxy-2-methylpropionate, ethyl 2-ethoxy-2-methylpropionate, or the like; esters such as 2-hydroxyethyl propionate, 2-hydroxy-2-methylethyl propionate, hydroxyethyl acetate, methyl 2-hydroxy-3-methylbutanoate, or the like; or ketonic acid esters such as ethyl pyruvate, or the like. In an implementation, the solvent may include, e.g., N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, or phenyl cellosolve acetate, which may be used alone or as a mixture of two or more.

In an implementation, considering miscibility and reactivity in the solvent, the solvent may include, e.g., glycol ethers such as ethylene glycol monoethyl ether, or the like; ethylene glycol alkylether acetates such as ethyl cellosolve acetate, or the like; esters such as 2-hydroxyethyl propionate, or the like; diethylene glycols such as diethylene glycol monomethyl ether, or the like; propylene glycol alkylether acetates such as propylene glycol monomethylether acetate, propylene glycol propylether acetate, or the like.

The solvent may be included in a balance amount, e.g., about 20 wt % to about 80 wt %, based on the total weight of the photosensitive resin composition. When the solvent is included within the range, the photosensitive resin composition may have excellent coating properties and maintain excellent flatness in a layer having a thickness of greater than or equal to 3 μm.

(F) Other Additives

In an implementation, the photosensitive resin composition may further include other additives, e.g., malonic acid; 3-amino-1,2-propanediol; a silane coupling agent including a vinyl group or a (meth)acryloxy group; a leveling agent; a fluorine surfactant; or a radical polymerization initiator, in order to help prevent stains or spots during the coating, to adjust leveling, or to help prevent pattern residue due to non-development.

In an implementation, the photosensitive resin composition may further include an epoxy compound in order to help improve close-contacting properties with a substrate.

Examples of the epoxy compound may include a phenol novolac epoxy compound, a tetramethyl biphenyl epoxy compound, a bisphenol A epoxy compound, an alicyclic epoxy compound, or a combination thereof.

An amount of the additive may be suitably controlled depending on desired properties.

Another embodiment may provide a color filter manufactured using the aforementioned photosensitive resin composition. A method of manufacturing the color filter may be as follows.

The photosensitive resin composition for a color filter may be coated to have a thickness of 3.1 μm to 3.4 μm using an appropriate method such as a spin coating, a slit coating, or the like, on a bare glass substrate or on a glass substrate on which a protective layer, $SiN_x$ is coated in a thickness of 500 Å to 1500 Å. After the coating, the composition may be irradiated with light to form a pattern for a color filter. After irradiation of the light, the coating layer may be treated with an alkali developing solution, and the non-irradiated region thereof may be dissolved, forming a pattern for a color filter. This process may be repeated depending on the desired number of R, G, and B colors, manufacturing a color filter having a desired pattern.

In addition, the image pattern acquired by the development may be cured through heat treatment, actinic ray irradiation, or the like, resultantly improving crack resistance, solvent resistance, and the like.

Another embodiment may provide a CMOS image sensor including the color filter.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Dimer Compounds

Synthesis Example 1: Synthesis of Compound Represented by Chemical Formula E-1

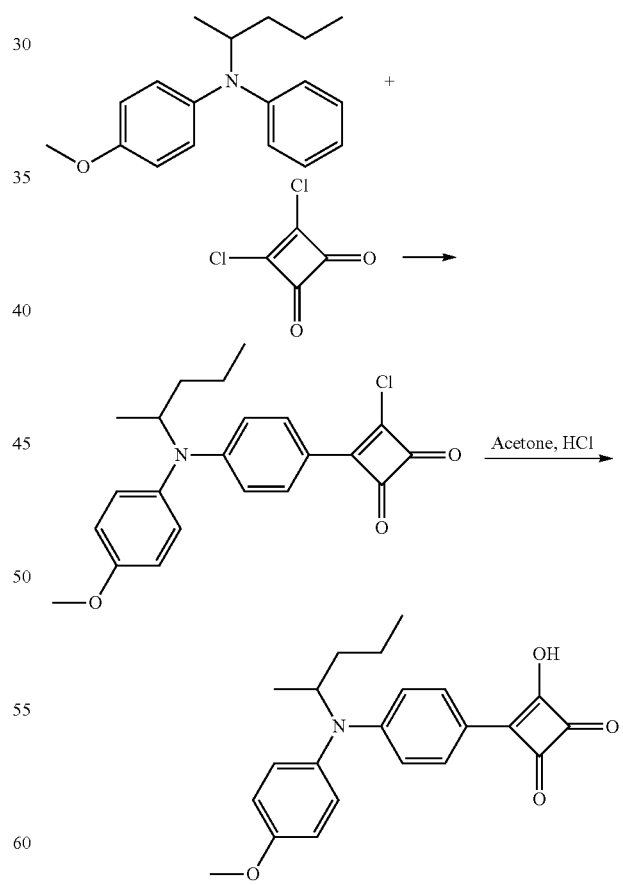

Intermediate 1-1

[4-methoxy-phenyl]-(1-methyl-pentyl)-phenyl-amine (10.2 g, 4.5 mmol) and 3,4-dichloro-3-cyclobutene-1,2-dione (6.15 g, 4.1 mmol) were added to toluene (200 mL)

and butanol (200 mL) and then, stirred under reflux for 1 hour, and then, the reactant was distilled under a reduced pressure and stirred under reflux with 80 ml of acetone and hydrogenchloride (20 ml, 2N) in water for 1 hour and MC-extracted, obtaining Intermediate 1-1.

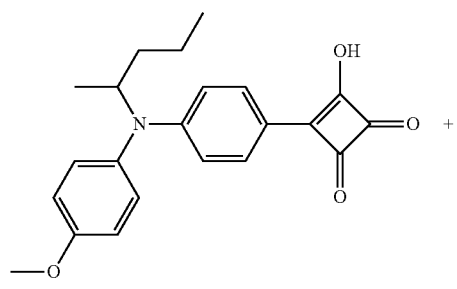

Intermediate 1-1

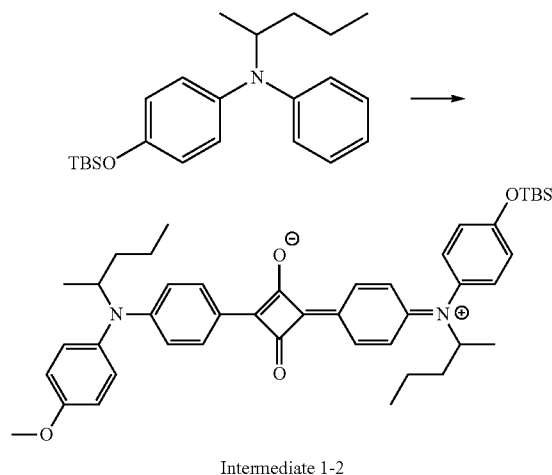

Intermediate 1-2

Intermediate 1-1 (50 mmol) and [4-(tert-butyl-dimethyl-silanyloxy)-phenyl]-(1-methyl-hexyl)-phenyl-amine (50 mmol) were added to toluene (300 mL) and butanol (300 mL) and refluxed, and water produced therefrom was removed by using a Dean-stark distillation device. After stirring the mixture for 12 hours, the reactant was distilled under a reduced pressure and purified through column chromatography, obtaining Intermediate 1-2.

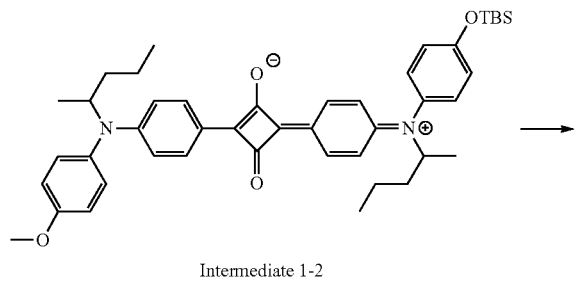

Intermediate 1-2

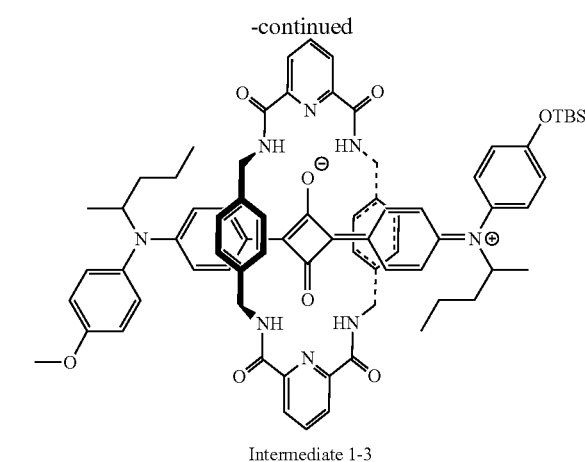

Intermediate 1-3

Intermediate 1-2 (5 mmol) was dissolved in 600 mL of chloroform, and pyridine-2,6-dicarbonyl dichloride (20 mmol) and p-xylylenediamine (20 mmol) were dissolved in 60 mL of chloroform and then, added dropwise thereto at ambient temperature for 5 hours. After 12 hours, the mixture was distilled under a reduced pressure and separated through column chromatography, obtaining Intermediate 1-3.

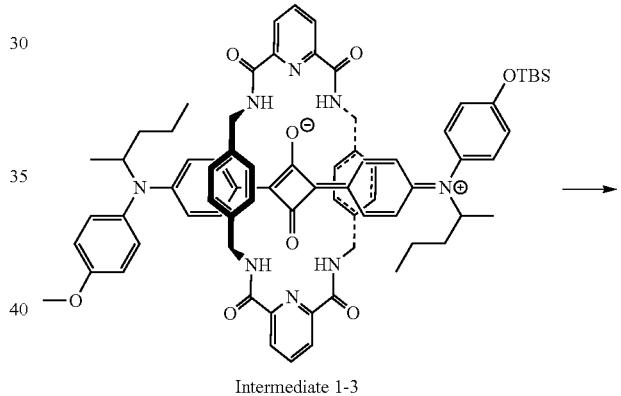

Intermediate 1-3

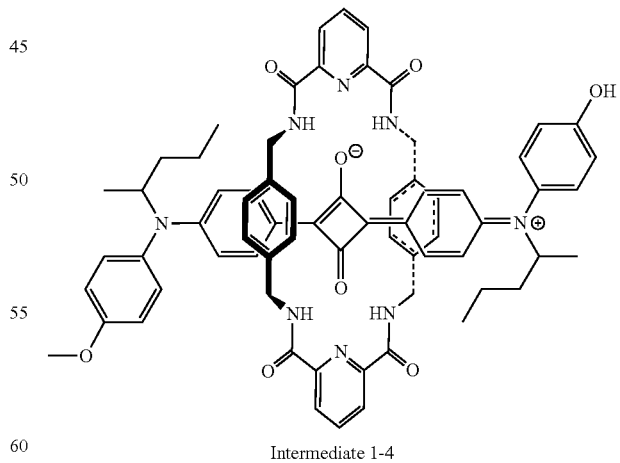

Intermediate 1-4

Intermediate 1-3 (5 mmol) was dissolved in 50 mL of tetrahydrofuran, and tetrabutylammonium fluoride (2.5 mmol) was added thereto at ambient temperature. After 30 minutes, the mixture was separated through column chromatography, selectively obtaining Intermediate 1-4.

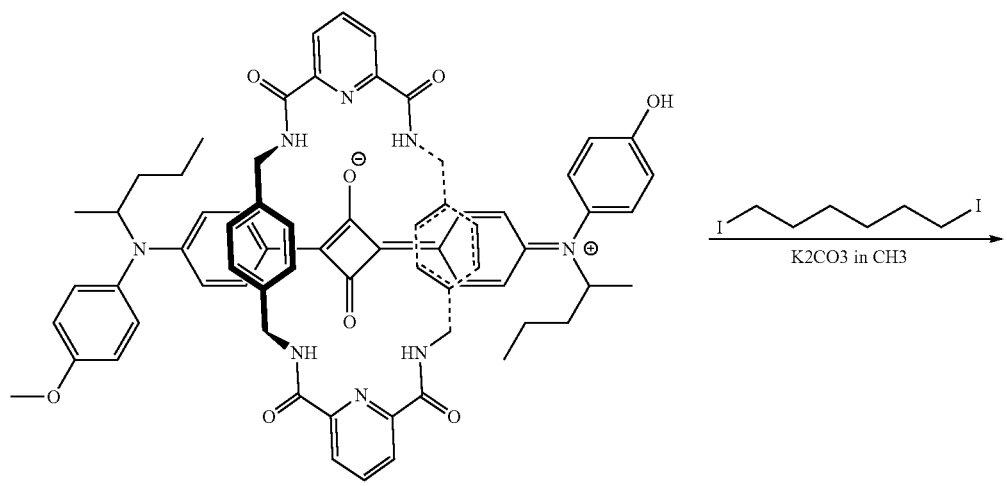
Intermediate 1-4
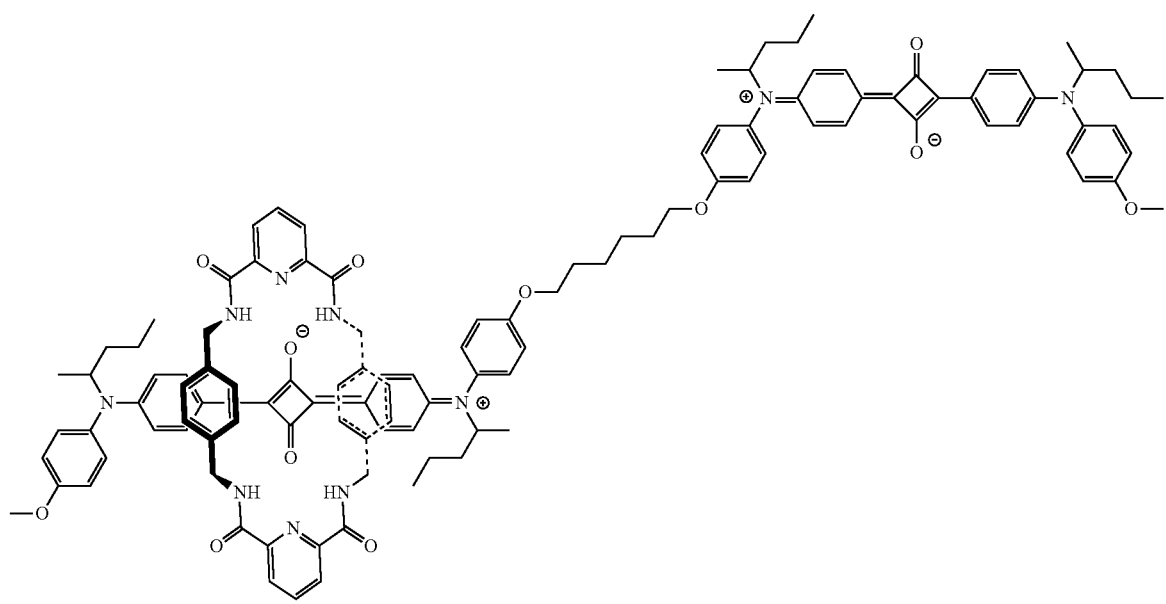
Intermediate 1-4 (10 mmol) was dissolved in 50 mL of chloroform, and potassium carbonate (5 mmol) and 1,6-diiodoethane (5 mmol) were added thereto at ambient temperature. After 1 hour, the mixture was separated through column chromatography, synthesizing a compound represented by Chemical Formula E-1.

[Chemical Formula E-1]
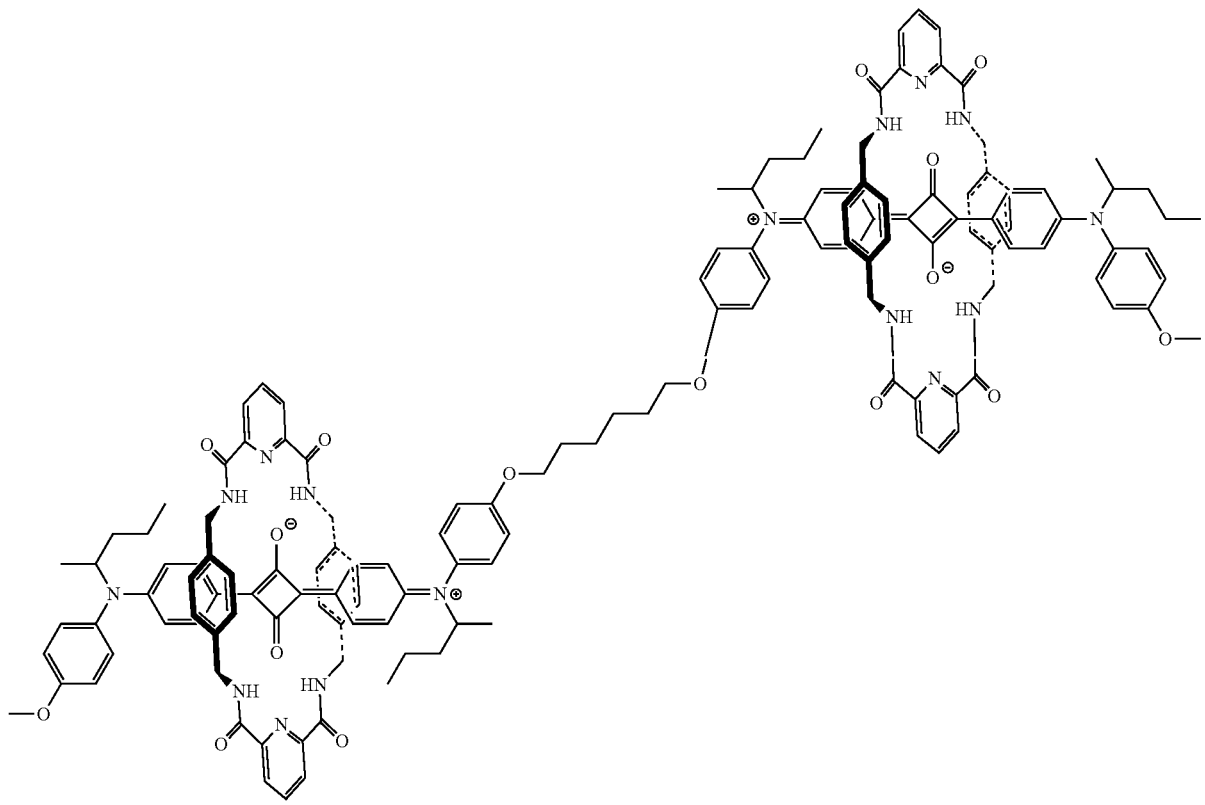
MALDI-TOF MS: 2356.85m/z
(Synthesis Example 2: Synthesis of Compound Represented by Chemical Formula E-2)
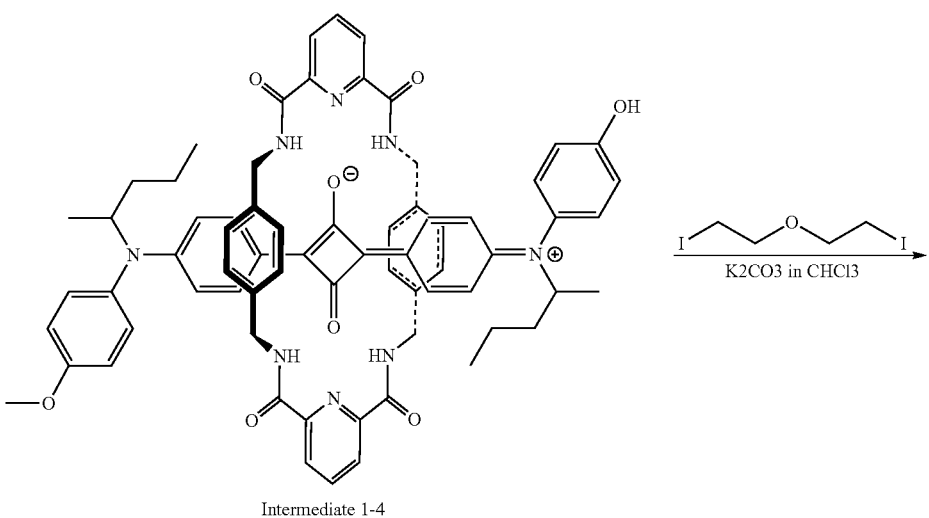
Intermediate 1-4

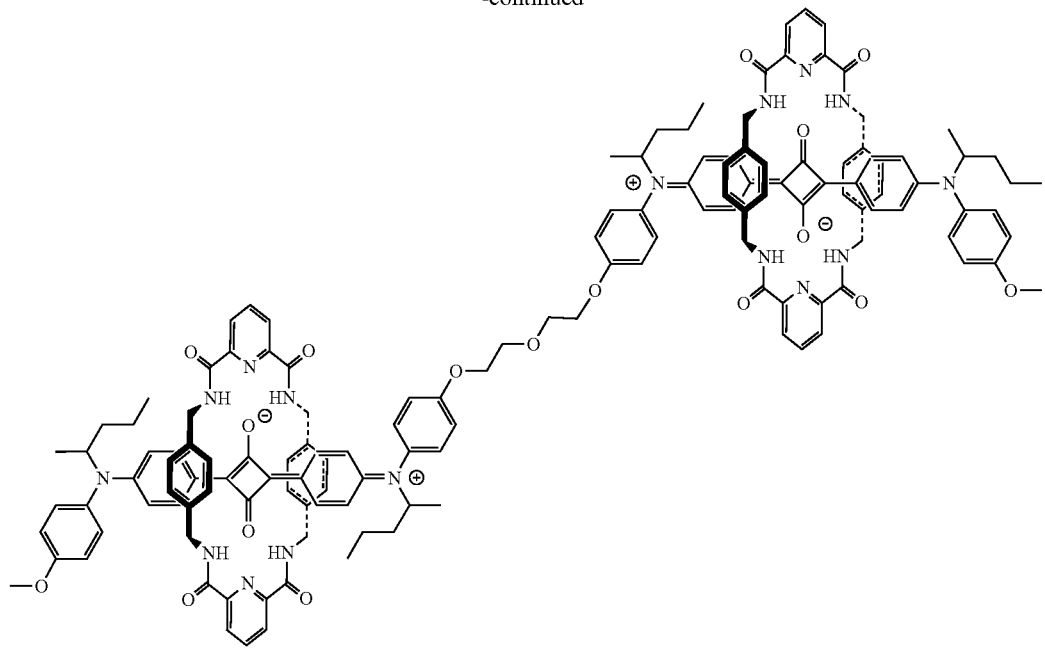
A compound represented by Chemical Formula E-2 was synthesized in the same manner as in Synthesis Example 1, except that bis(2-iodoethyl) ether instead of the 1,6-diiodohexane was added.
[Chemical Formula E-2]
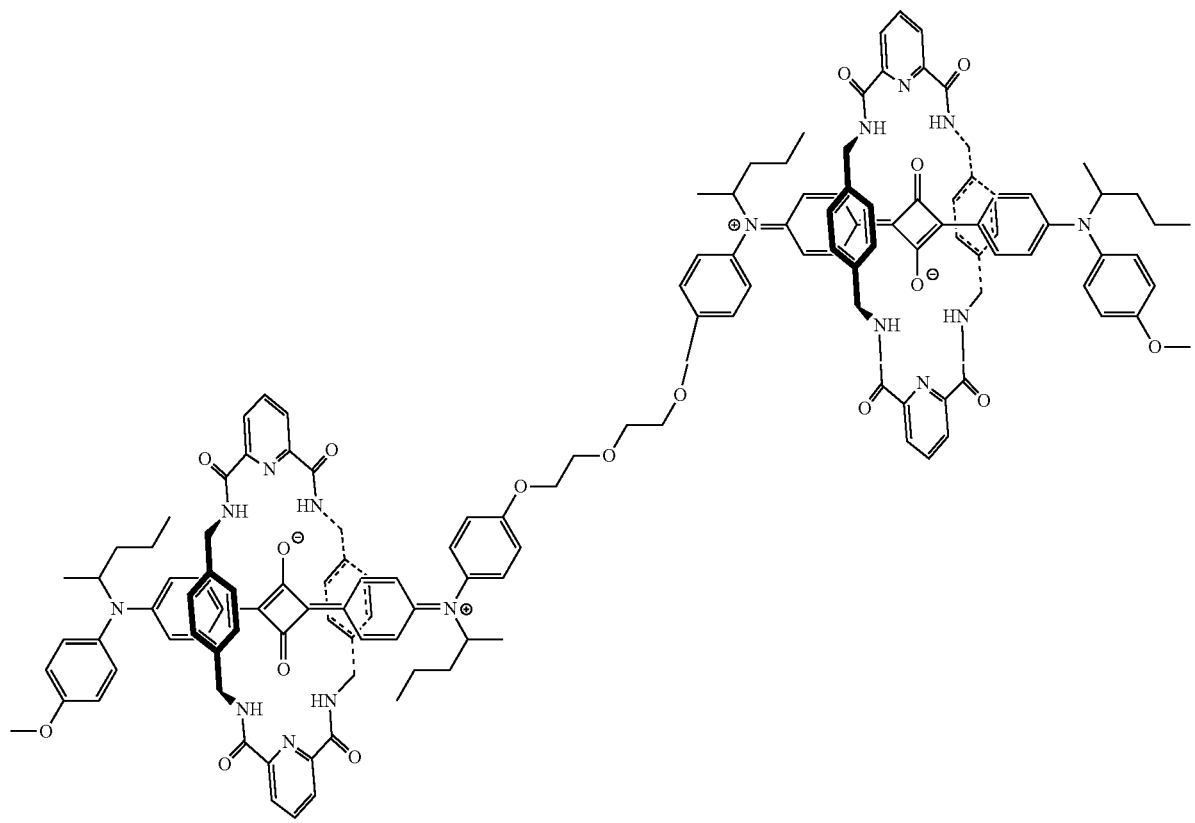
MALDI-TOF MS: 2344.79m/z (Synthesis Example 3: Synthesis of Compound Represented by Chemical Formula E-3)
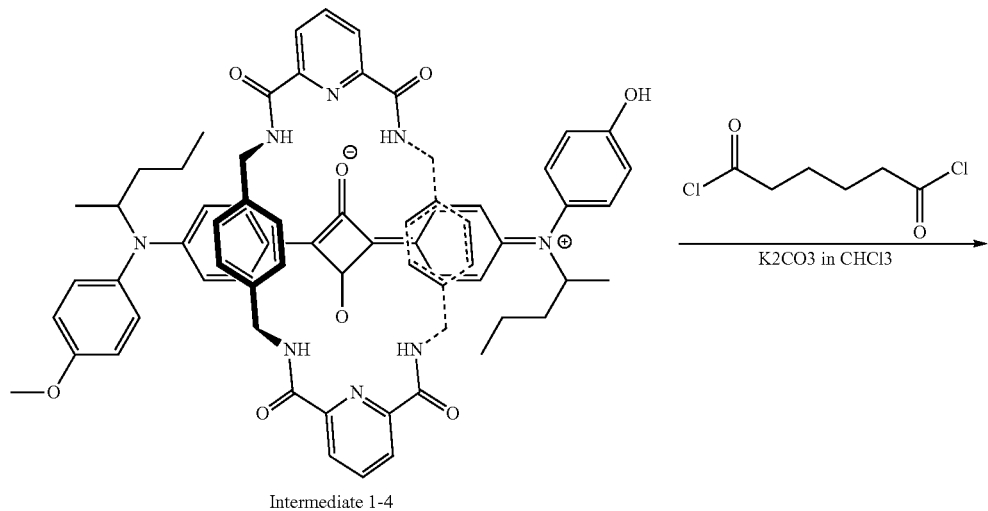
Intermediate 1-4
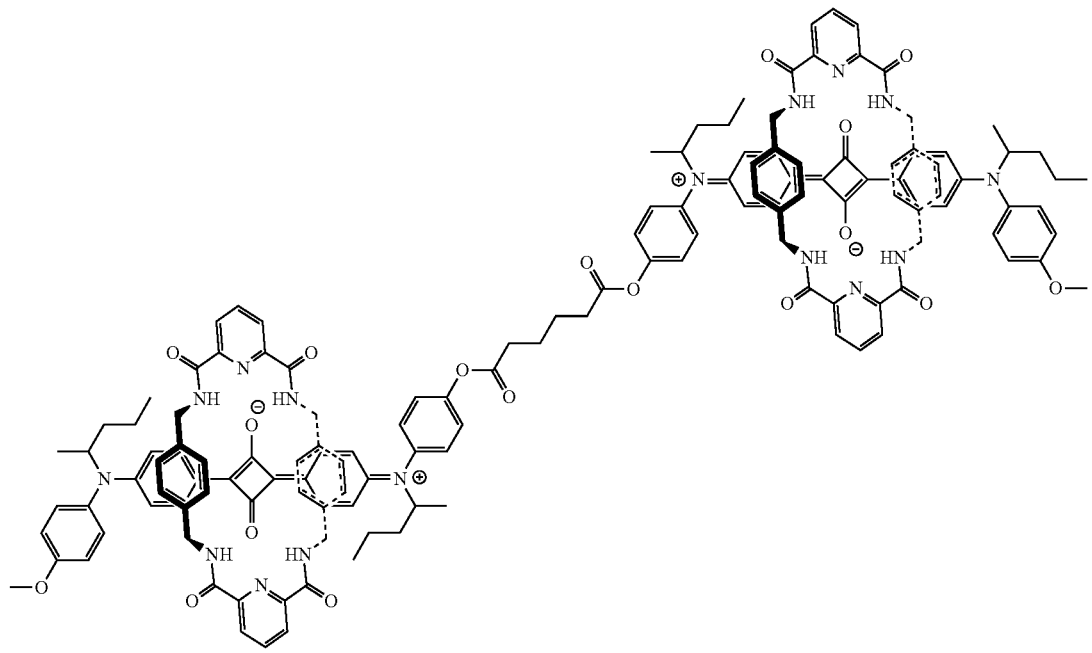
A compound represented by Chemical Formula E-3 was synthesized in the same manner as in Synthesis Example 1, except that adipoyl chloride instead of the 1,6-diiodohexane was added.

[Chemical Formula E-3]
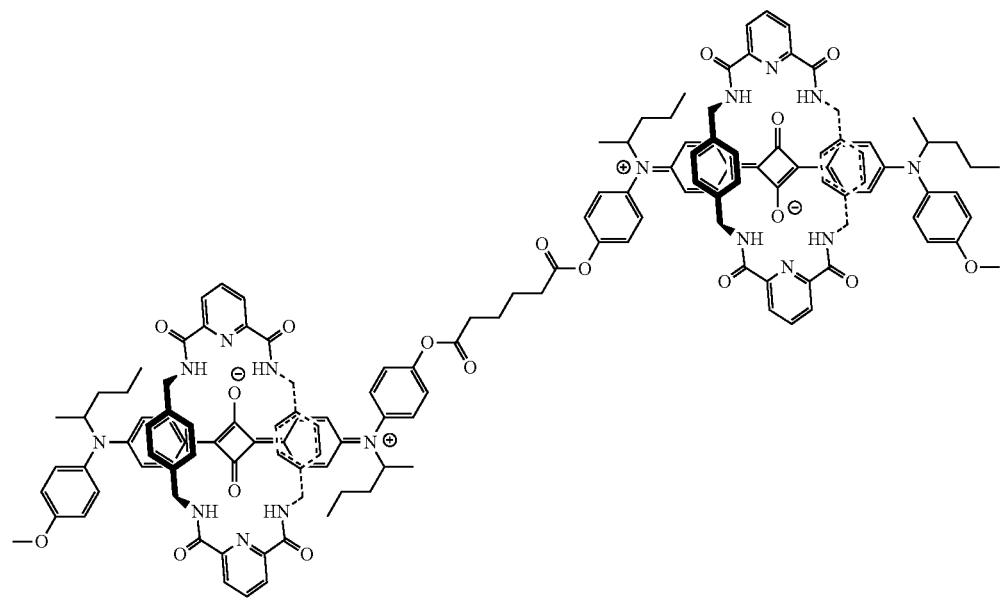
40
MALDI-TOF MS: 2384.81m/z
(Synthesis Example 4: Synthesis of Compound Represented by Chemical Formula E-4)
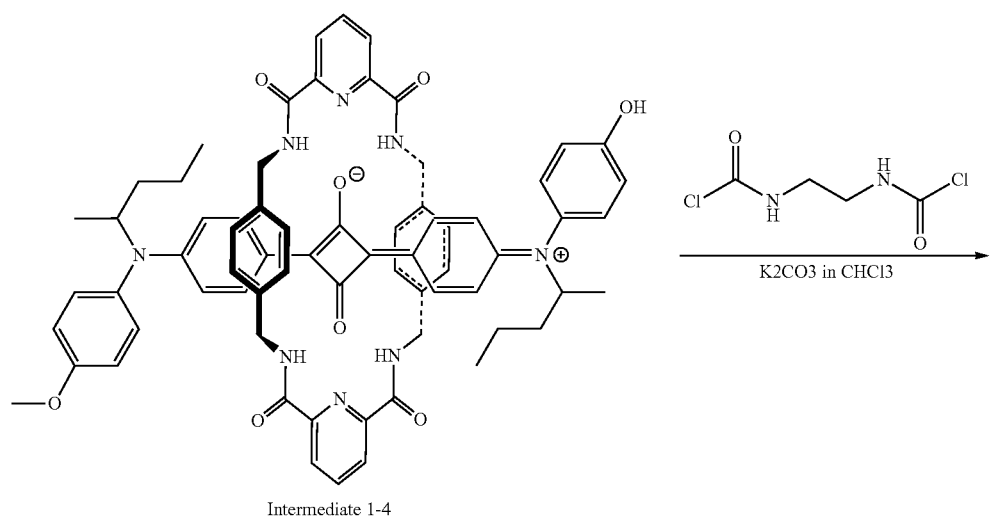
Intermediate 1-4

-continued
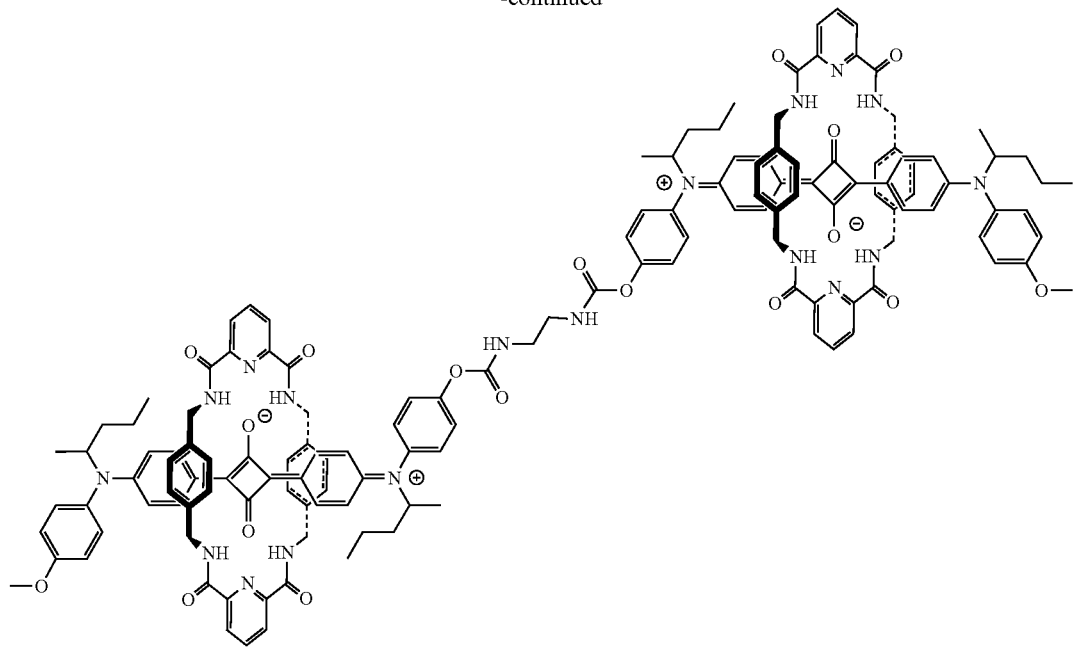
A compound represented by Chemical Formula E-4 was synthesized in the same manner as in Synthesis Example 1, except that ethylendicarbamoyl chloride instead of the 1,6-diiodohexane was added.
[Chemical Formula E-4]
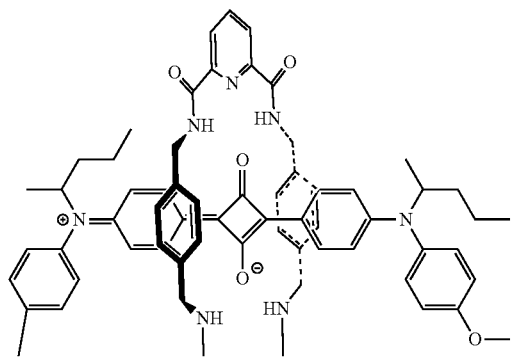

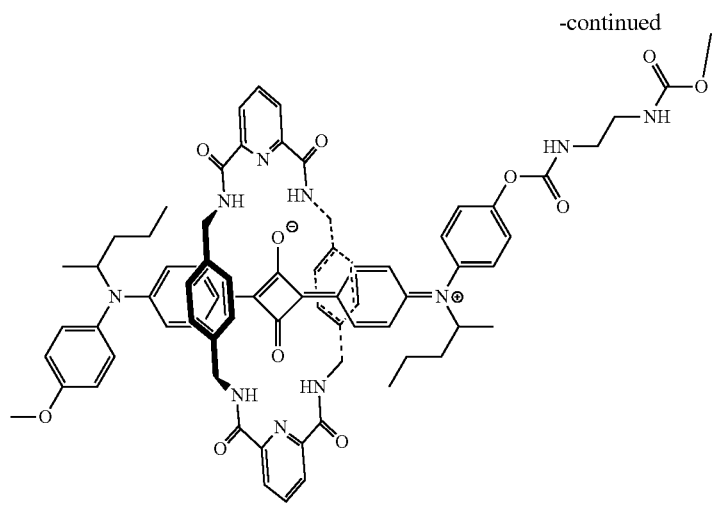

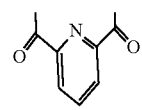

MALDI-TOF MS: 2386.79m/z

Synthesis Example 5: Synthesis of Compound Represented by Chemical Formula E-5

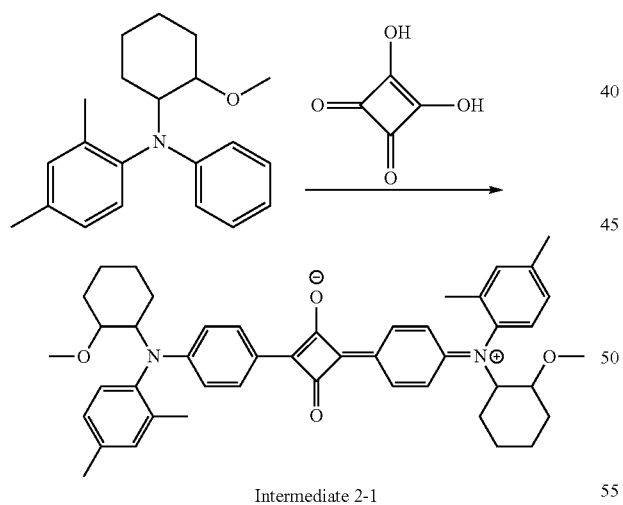

Intermediate 2-1

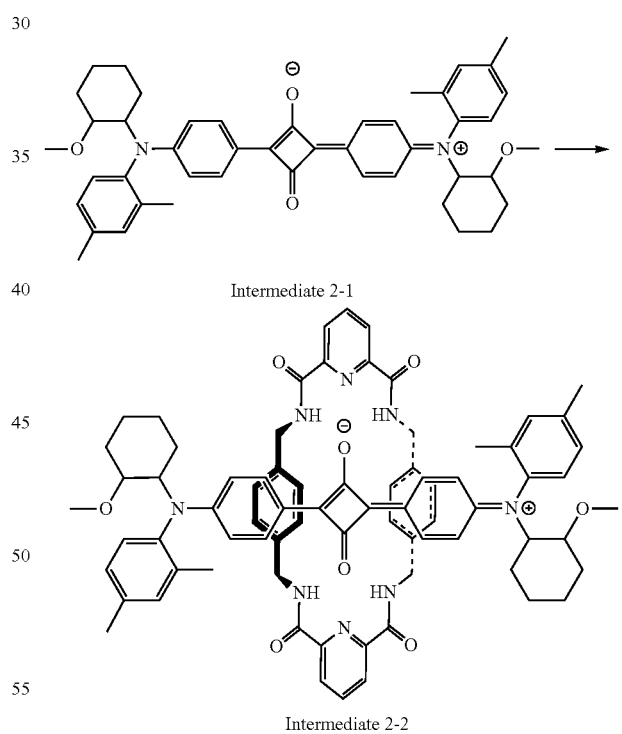

Intermediate 2-1

Intermediate 2-2

[(2,4-dimethyl)-phenyl]-(2-methoxy cyclohexyl)-phenyl-amine (100 mmol) and 3,4-dihydroxy-cyclobut-3-ene-1,2-dione (50 mmol) were added to toluene (300 mL) and butanol (300 mL) and then, refluxed, and water produced therein was removed by using a Dean-stark distillation device. After 12 hours, the reactant was stirred, distilled under a reduced pressure, and purified through column chromatography, obtaining Intermediate 2.1

Intermediate 2-1 (5 mmol) was dissolved in 600 mL of chloroform, and pyridine-2,6-dicarbonyl dichloride (20 mmol) and p-xylylenediamine (20 mmol) were dissolved in 60 mL of chloroform and then, simultaneously added dropwise thereto at ambient temperature for 5 hours. After 12 hours, the reactant was distilled under a reduced pressure and separated through column chromatography, obtaining Intermediate 2-2.

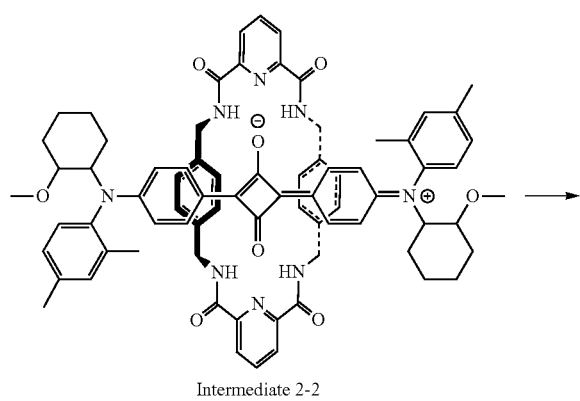
Intermediate 2-2
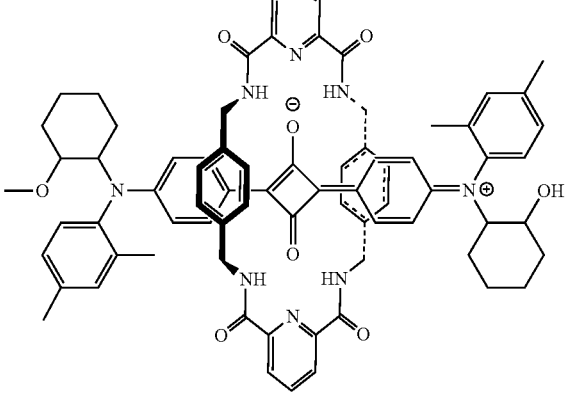
Intermediate 2-3
Intermediate 2-2 (5 mmol) was dissolved in 50 mL of tetrahydrofuran, and $BBr_3$ (2.5 mmol) and KI (3 mmol) were added thereto at ambient temperature. After 30 minutes, the mixture was separated through column chromatography, selectively obtaining Intermediate 2-3.
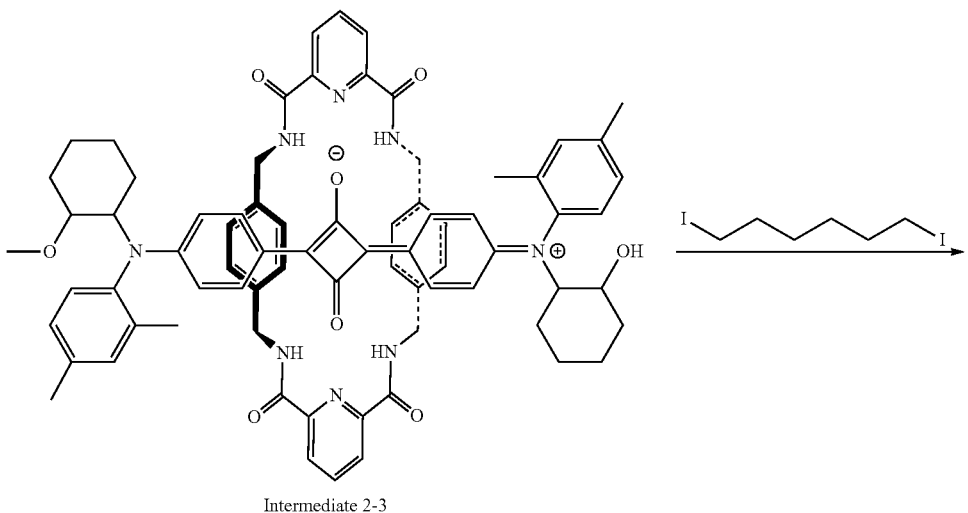
Intermediate 2-3
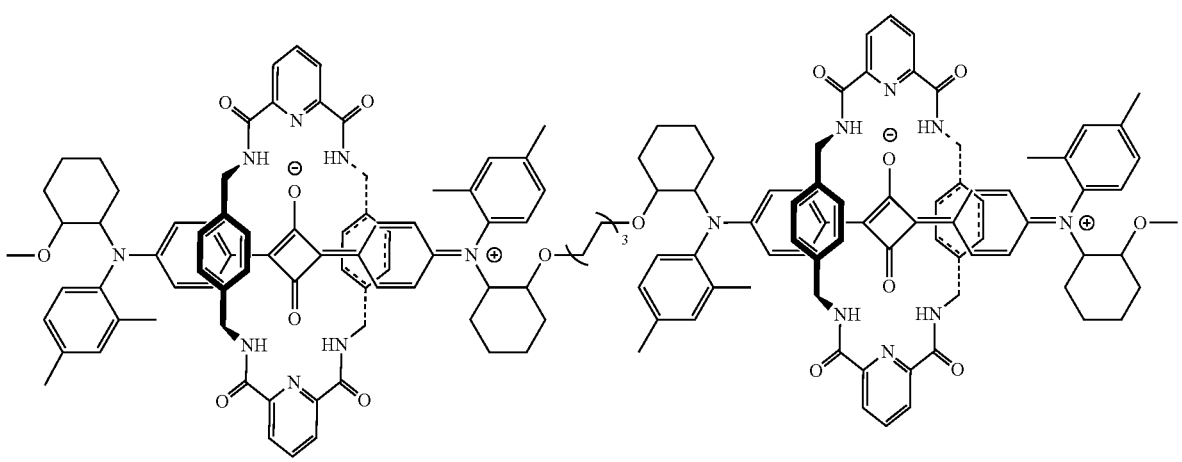

Intermediate 2-3 (10 mmol) was dissolved in 50 mL of chloroform, and potassium carbonate (5 mmol) and 1,6-diiodoethane (5 mmol) were added thereto at ambient temperature. After 1 hour, the mixture was separated through column chromatography, synthesizing a compound represented by Chemical Formula E-5.

[Chemical Formula E-5]

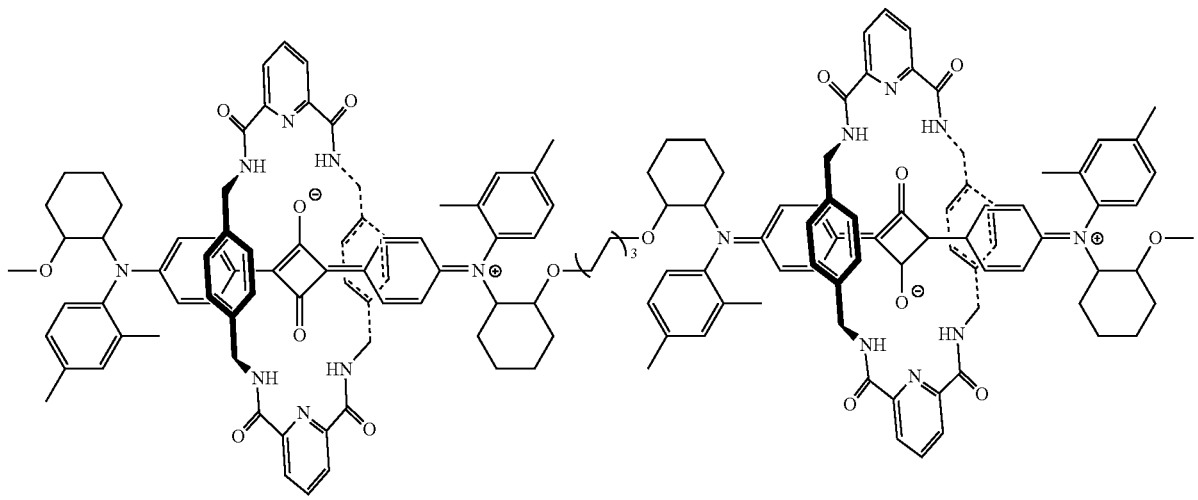

MALDI-TOF MS: 2461m/z

Comparative Synthesis Example 1: Synthesis of Compound Represented by Chemical Formula X

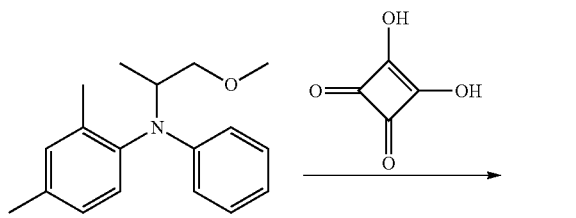

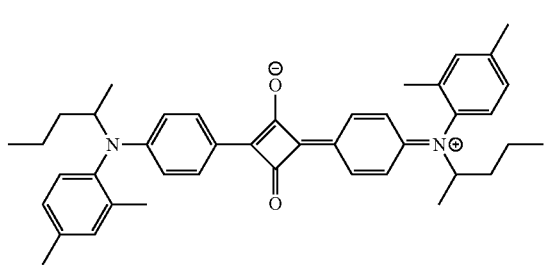

Intermediate 3-1

[(2,4-dimethyl)-phenyl]-(1-Methyl-propyl)-phenyl-amine (100 mmol) and 3,4-dihydroxy-cyclobut-3-ene-1,2-dione (50 mmol) were added to toluene (300 mL) and butanol (300 mL) and then, refluxed, and water produced therein was removed by using a Dean-stark distillation device. The reactant was stirred for 12 hours, distilled under a reduced pressure, and purified through column chromatography, obtaining Intermediate 3-1.

The compound represented by Intermediate 3-1 (5 mmol) was dissolved in 600 mL of chloroform, pyridine-2,6-dicarbonyl dichloride (20 mmol), and a solution prepared by dissolving pyridine-2,6-dicarbonyl dichloride (20 mmol) and p-xylylene diamine (20 mmol) in 60 mL of chloroform is added dropwise thereto at ambient temperature for 5 hours. After 12 hours, the obtained mixture was distilled under a reduced pressure and then, separated through column chromatography, obtaining a compound represented by Chemical Formula X.

[Chemical Formula X]

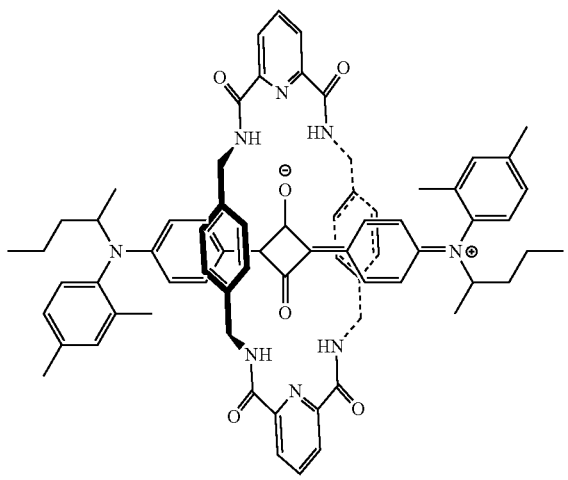

MALDI-TOF MS: 1147.43m/z (Preparation of Photosensitive Resin Composition)

Photosensitive resin compositions were prepared using the following components.

(A) Dye
- (A-1) Compound prepared in Synthesis Example 1 (represented by Chemical Formula E-1)
- (A-2) Compound prepared in Synthesis Example 2 (represented by Chemical Formula E-2)
- (A-3) Compound prepared in Synthesis Example 3 (represented by Chemical Formula E-3)
- (A-4) Compound prepared in Synthesis Example 4 (represented by Chemical Formula E-4)
- (A-5) Compound prepared in Synthesis Example 5 (represented by Chemical Formula E-5)
- (A-6) Compound prepared in Comparative Synthesis Example 1 (represented by Chemical Formula X)

(A') Pigment Dispersion
- (A'-1) C.I. green pigment 7
- (A'-2) C.I. green pigment 58

(B) Binder Resin

A methacrylic acid/benzylmethacrylate copolymer having a weight average molecular weight of 22,000 g/mol (a mixing weight ratio: 15 wt %/85 wt %)

(C) Photopolymerizable Monomer

Dipentaerythritolhexaacrylate (D) Photopolymerization Initiator
- (D-1) 1,2-octandione
- (D-2) 2-dimethylamino-2-(4-methyl-benzyl)-1-(4-morpholin-4-yl-phenyl)-butan-1-one (E) Solvent
- (E-1) Cyclohexanone
- (E-2) propylene glycol methyletheracetate Examples 1 to 5 and Comparative Examples 1 to 4

Photosensitive resin compositions were prepared by mixing each component in the compositions shown in Table 1. Specifically, the photopolymerization initiator was dissolved in a solvent, the solution was stirred at ambient temperature for 2 hours, the dye (or pigment dispersion) was added thereto, the mixture was stirred for 30 minutes, the binder resin and the photopolymerizable monomer were added thereto, and the obtained mixture was stirred at ambient temperature for 2 hours. The solution was filtered three times to remove impurities and prepare a photosensitive resin composition.

TABLE 1

(unit: wt %)

| | | Examples | | | | | Comparative Examples | | | |
|---|---|---|---|---|---|---|---|---|---|---|
| | | 1 | 2 | 3 | 4 | 5 | 1 | 2 | 3 | 4 |
| (A) Dye | A-1 | 2 | — | — | — | — | — | — | — | — |
| | A-2 | — | 2 | — | — | — | — | — | — | — |
| | A-3 | — | — | 2 | — | — | — | — | — | — |
| | A-4 | — | — | — | 2 | — | — | — | — | — |
| | A-5 | — | — | — | — | 2 | — | — | — | — |
| | A-6 | — | — | — | — | — | 2 | — | — | — |
| (A') Pigment dispersion | A'-1 | — | — | — | — | — | — | — | 2 | — |
| | A'-2 | — | — | — | — | — | — | — | — | 2 |
| (B) Binder resin | | 3.5 | 3.5 | 3.5 | 3.5 | 3.5 | 3.5 | 3.5 | 3.5 | 3.5 |
| (C) Photopolymerizable monomer | | 8 | 8 | 8 | 8 | 8 | 8 | 8 | 8 | 8 |
| (D) Photopolymerization initiator | D-1 | 1 | 1 | 1 | 1 | 1 | 1 | 1 | 1 | 1 |
| | D-2 | 0.5 | 0.5 | 0.5 | 0.5 | 0.5 | 0.5 | 0.5 | 0.5 | 0.5 |
| (E) Solvent | E-1 | 40 | 40 | 40 | 40 | 40 | 40 | 40 | 40 | 40 |
| | E-2 | 45 | 45 | 45 | 45 | 45 | 45 | 45 | 45 | 45 |
| Total | | 100 | 100 | 100 | 100 | 100 | 100 | 100 | 100 | 100 |

Evaluation

Measurement of Heat Resistance, Chemical Resistance, and Luminance

The photosensitive resin compositions according to Examples 1 to 5 and Comparative Examples 1 to 4 were respectively coated to be 1 μm to 3 μm thick on a 1 mm-thick degreased glass substrate and dried on a 90° C. hot plate for 2 minutes, obtaining films. Subsequently, a high-pressure mercury lamp with a main wavelength of 365 nm was used to expose the front surfaces of the films. Then, the films were dried in a 230° C. hot air circulation drying furnace for 20 minutes, obtaining samples with the same thickness. The pixel layers were measured with respect to luminance (GY@Gy 0.635), heat resistance, and chemical resistance by using a spectrophotometer (MCPD3000, Otsuka Electronics Co., Ltd.), and the results are shown in Table 2.

(1) Measurement of Heat Resistance

The prepared samples were further treated at 230° C. for 60 minutes in a convection oven and then, evaluated with respect to color changes before and after the treatment by using MCPD (Otsuka, Inc.) equipment to evaluate color characteristics based on a C light source. ΔEab* was calculated to measure the heat resistance.

(2) Measurement of Chemical Resistance (Elution Resistance)

The prepared samples were cut into a size of 2 cm×2 cm and precipitated in a PGMEA solution at 90° C. for 10 min, and color changes of the samples before and after the treatment were examined by using MCPD (Otsuka, Inc.) equipment to evaluate color characteristics based on a C light source. ΔEab* was calculated to measure the chemical resistance.

(3) Measurement of Luminance

The prepared samples were evaluated with respect to color characteristics based on a C light source by using MCPD (Otsuka Inc.) equipment. The results were used to measure luminance (GY) with reference to Gy 0.635.

TABLE 2

|  | Heat resistance (ΔEab*) | Chemical resistance (ΔEab*) |
| --- | --- | --- |
| Example 1 | 2.5 | 20 |
| Example 2 | 2.6 | 15 |
| Example 3 | 2.4 | 19 |
| Example 4 | 2.5 | 20 |
| Example 5 | 2.8 | 18 |
| Comparative Example 1 | 3.8 | 89 |
| Comparative Example 2 | NG | NG |
| Comparative Example 3 | NG | NG |
| Comparative Example 4 | NG | NG |

Referring to Table 2, Examples 1 to 5, including the compound according to an embodiment as a dye, compared with Comparative Examples 1 to 4, exhibited excellent chemical resistance and heat resistance and thus high luminance. In addition, when a colorant was not included at all, or pigment dispersion alone was included as a colorant, heat resistance and chemical resistance were too inferior to be applicable to actual processes (e.g., indicated as "NG").

By way of summation and review, a color filter manufactured by using a pigment photosensitive resin composition may be limited in terms of luminance and a contrast ratio due to sizes of pigment particles. A color image device for an image sensor may use a much smaller dispersion particle size for forming a fine pattern. In order to meet this need, implementing a color filter with improved luminance and contrast ratio by introducing a dye not forming particles instead of a pigment to prepare a photosensitive resin composition suitable for the dye has been considered. The dye could deteriorate luminance due to inferior durability such as light resistance, heat resistance, or the like, relative to that of the pigment.

One or more embodiments may provide a dye compound having excellent chemical resistance and heat resistance.

By using the compound according to the embodiment as a green dye, a color filter having excellent chemical resistance and heat resistance may be implemented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound represented by Chemical Formula 1:

A-L-B　　　[Chemical Formula 1]

wherein:

in Chemical Formula 1,

A and B are each independently a moiety having a core-shell structure, the core is represented by Chemical Formula 1-1, the shell is represented by Chemical Formula 2-1 or Chemical Formula 2-2, and L is a linking group represented by Chemical Formula 3,

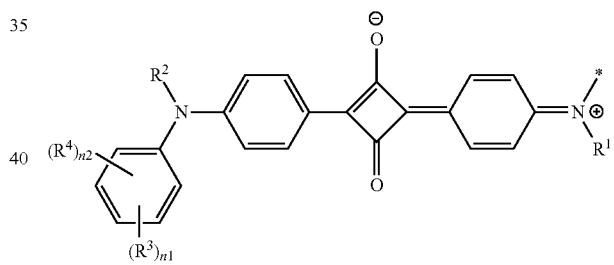

[Chemical Formula 1-1]

in Chemical Formula 1-1, $R^1$ to $R^4$ are each independently a halogen, a cyano group, a silane group, siloxane group, a substituted or unsubstituted epoxy group, a substituted or unsubstituted C2 to C20 alkenyl group, a substituted or unsubstituted C1 to C20 alkyl group, a substituted or unsubstituted C3 to C20 cycloalkyl group, a substituted or unsubstituted C1 to C20 alkoxy group, or a substituted or unsubstituted C6 to C20 aryl group,

* is a linking point, and n1 and n2 are each independently an integer of 0 to 5, provided that $0 \leq n1+n2 \leq 5$,

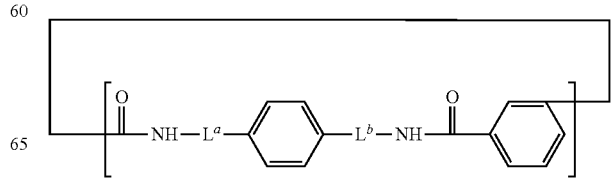

[Chemical Formula 2-1]

-continued

[Chemical Formula 2-2]

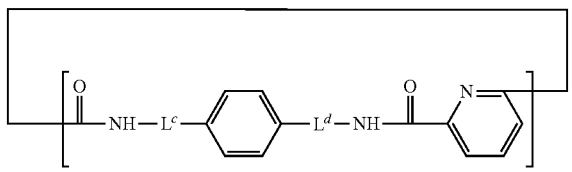

in Chemical Formula 2-1 and Chemical Formula 2-2, $L^a$ to $L^d$ are each independently a single bond or a substituted or unsubstituted C1 to C10 alkylene group,

[Chemical Formula 3]

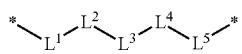

in Chemical Formula 3,
$L^1$ to $L^5$ are each independently a single bond, an ether group (*—O—*), *—OC(=O)—*, *—C(=O)O—*, *—O(C=O)NH—*, *—NHC(=O)O—*, a substituted or unsubstituted C1 to C20 alkylene group, a substituted or unsubstituted C3 to C20 cycloalkylene group, a substituted or unsubstituted C6 to C20 arylene group, or a group represented by Chemical Formula L-1, and
* is a linking point,

[Chemical Formula L-1]

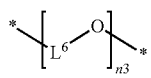

in Chemical Formula L-1,
$L^6$ is a substituted or unsubstituted C1 to C10 alkylene group,
* is a linking point, and
n3 is an integer of 1 to 10.

2. The compound as claimed in claim 1, wherein at least one of $R^2$ to $R^4$ is substituted with a (meth)acrylate group at a terminal end thereof.

3. The compound as claimed in claim 1, wherein:
$L^1$ and $L^5$ are each independently a substituted or unsubstituted C6 to C20 arylene group, and
$R^1$ is a halogen, a cyano group, a silane group, siloxane group, a substituted or unsubstituted epoxy group, a substituted or unsubstituted C2 to C20 alkenyl group, a substituted or unsubstituted C1 to C20 alkyl group, a substituted or unsubstituted C3 to C20 cycloalkyl group, or a substituted or unsubstituted C1 to C20 alkoxy group.

4. The compound as claimed in claim 1, wherein:
$L^1$ and $L^5$ are each independently a substituted or unsubstituted C3 to C20 cycloalkylene group, and
$R^1$ is a halogen, a cyano group, a silane group, siloxane group, a substituted or unsubstituted epoxy group, a substituted or unsubstituted C2 to C20 alkenyl group, a substituted or unsubstituted C1 to C20 alkyl group, a substituted or unsubstituted C1 to C20 alkoxy group, or a substituted or unsubstituted C6 to C20 aryl group.

5. The compound as claimed in claim 3, wherein $L^2$ and $L^4$ are each independently a single bond, an ether group (*—O—*), *—OC(=O)—*, *—C(=O)O—*, *—O(C=O)NH—*, *—NHC(=O)O—*, or a group represented by Chemical Formula L-1.

6. The compound as claimed in claim 3, wherein $L^5$ is a single bond, a substituted or unsubstituted C1 to C20 alkylene group, or a group represented by Chemical Formula L-1.

7. The compound as claimed in claim 1, wherein $L^a$ to $L^d$ are each independently a substituted or unsubstituted C1 to C10 alkylene group.

8. The compound as claimed in claim 7, wherein the shell is represented by Chemical Formula 2-1-1 or Chemical Formula 2-2-1,

[Chemical Formula 2-1-1]

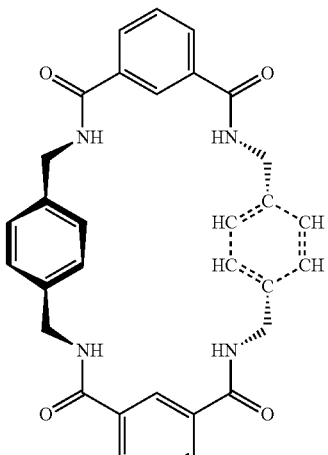

[Chemical Formula 2-2-1]

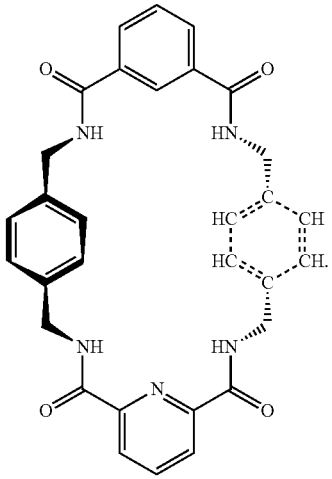

9. The compound as claimed in claim 1, wherein the shell has a cage width of about 6.5 Å to about 7.5 Å.

10. The compound as claimed in claim 1, wherein the core has a length of about 1 nm to about 3 nm.

11. The compound as claimed in claim 1, wherein the core has a maximum absorption peak at a wavelength of about 530 nm to about 680 nm.

12. The compound as claimed in claim 1, wherein:
the compound represented by Chemical Formula 1 is represented by one of Chemical Formula A-1 to Chemical Formula E-1,

[Chemical Formula A-1]
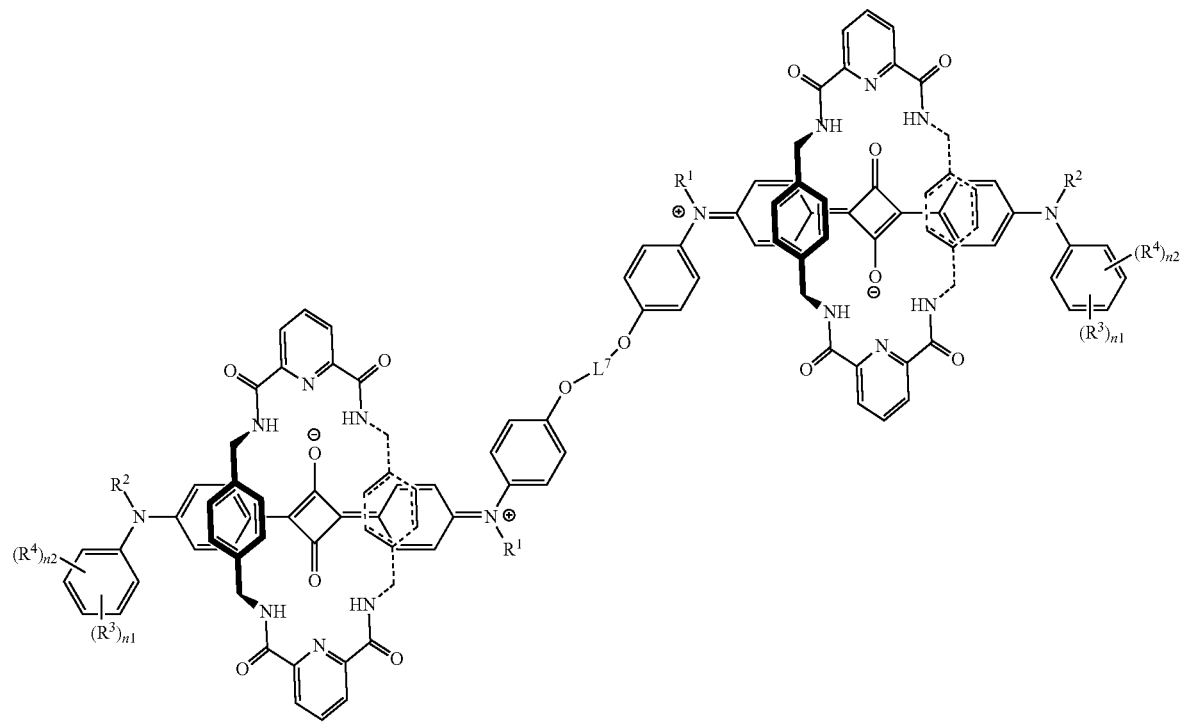
[Chemical Formula A-2]
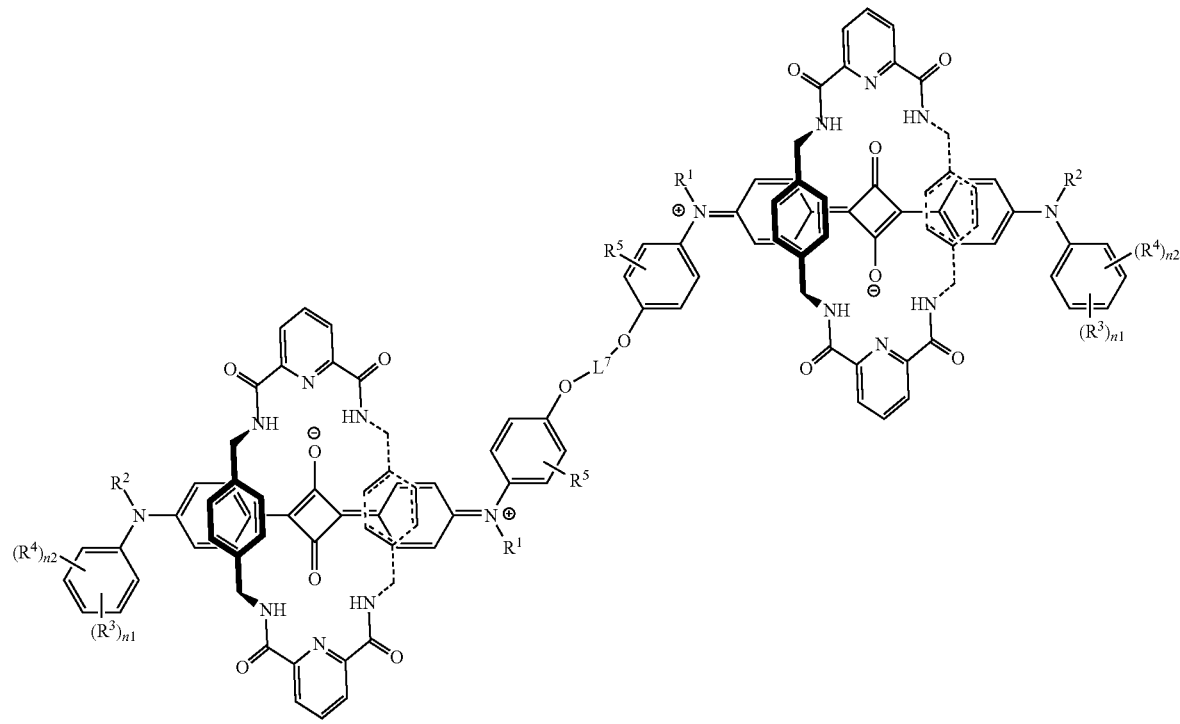

[Chemical Formula A-3]
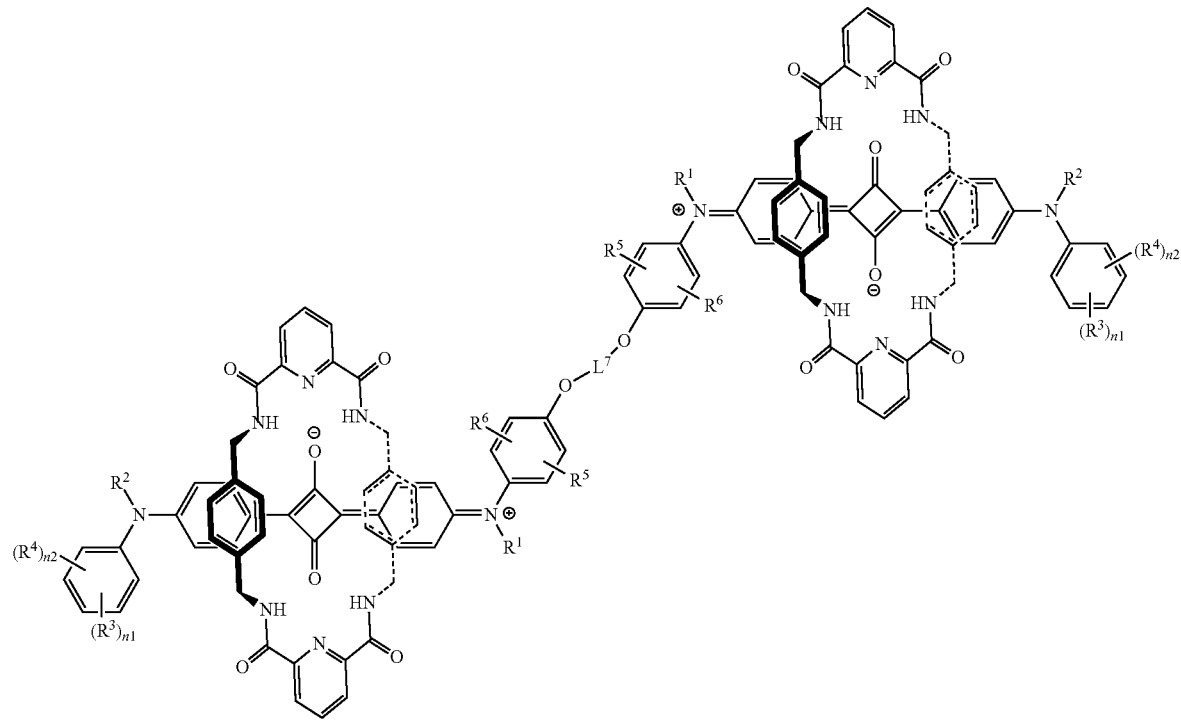
[Chemical Formula B-1]
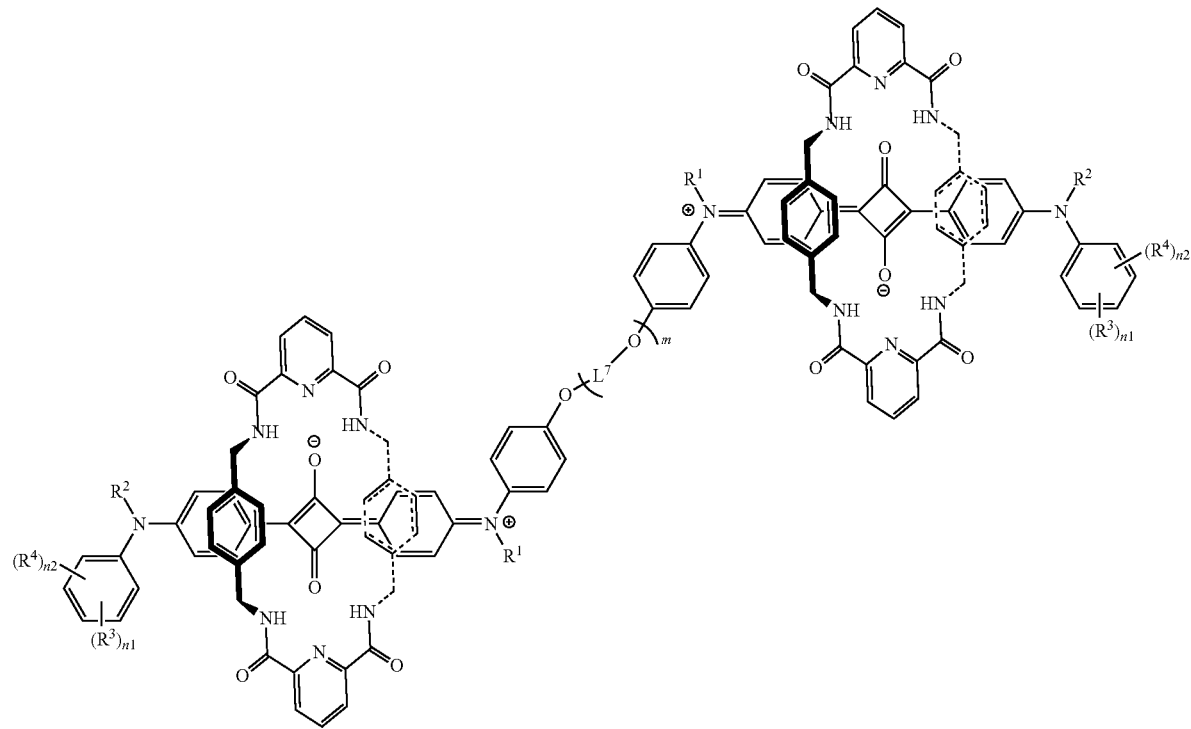

[Chemical Formula B-2]
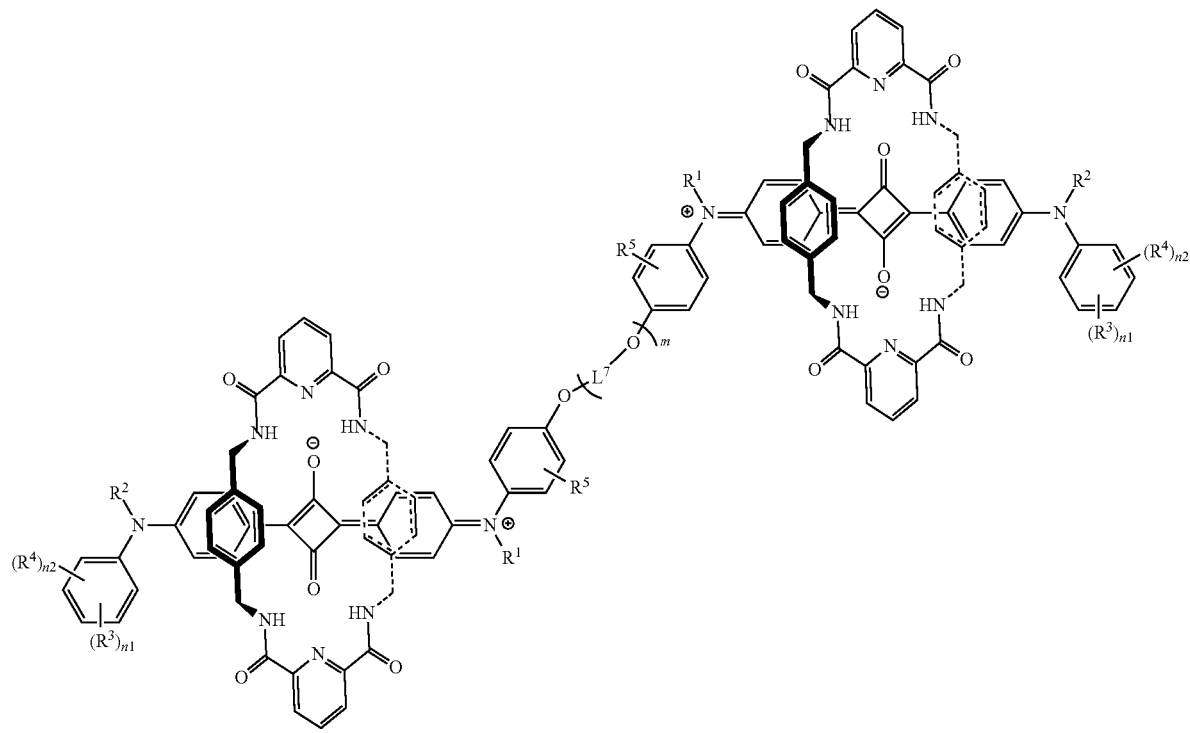
[Chemical Formula B-3]
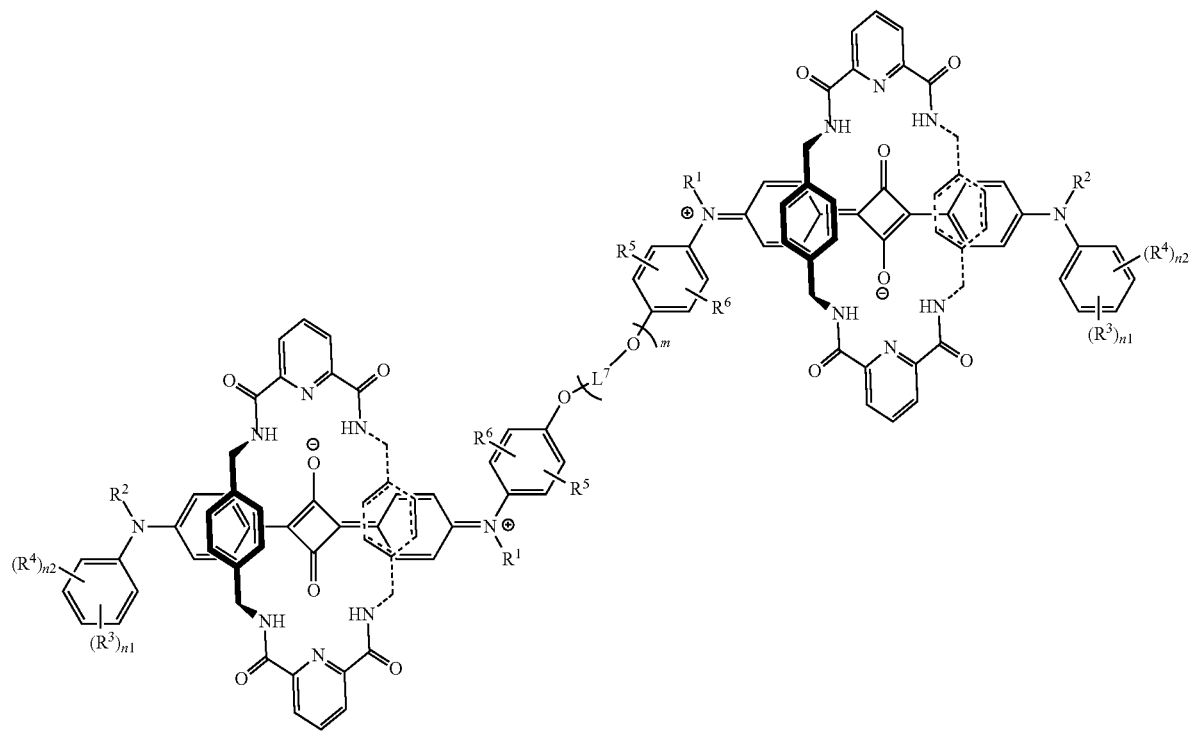

[Chemical Formula C-1]
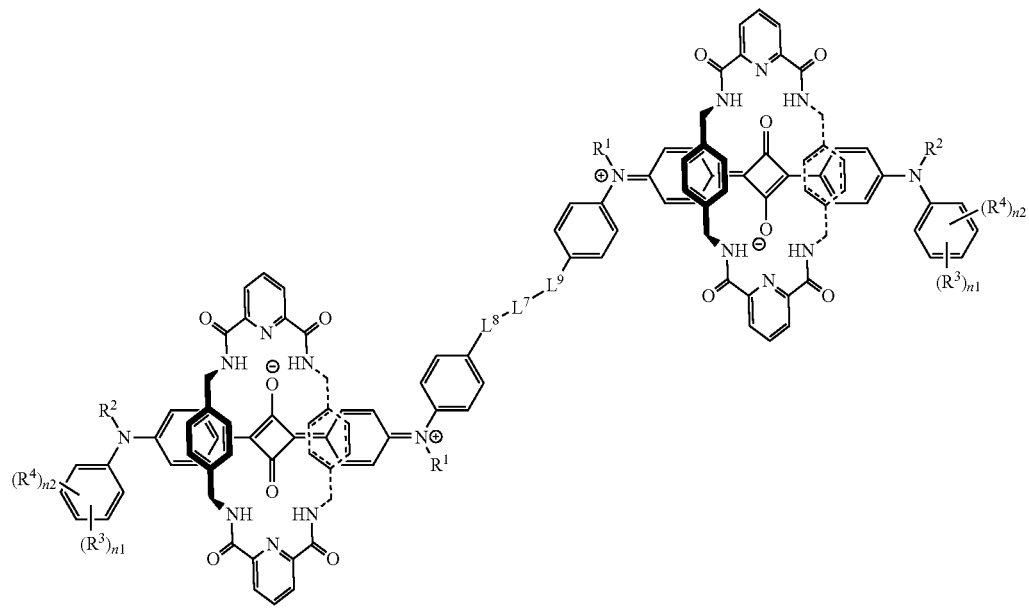
[Chemical Formula C-2]
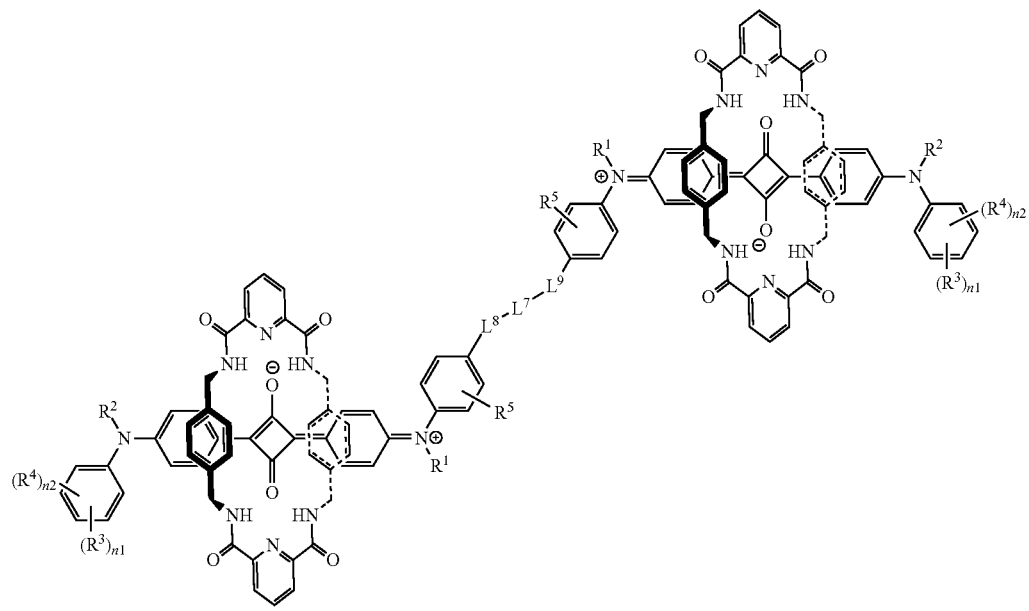

[Chemical Formula C-3]
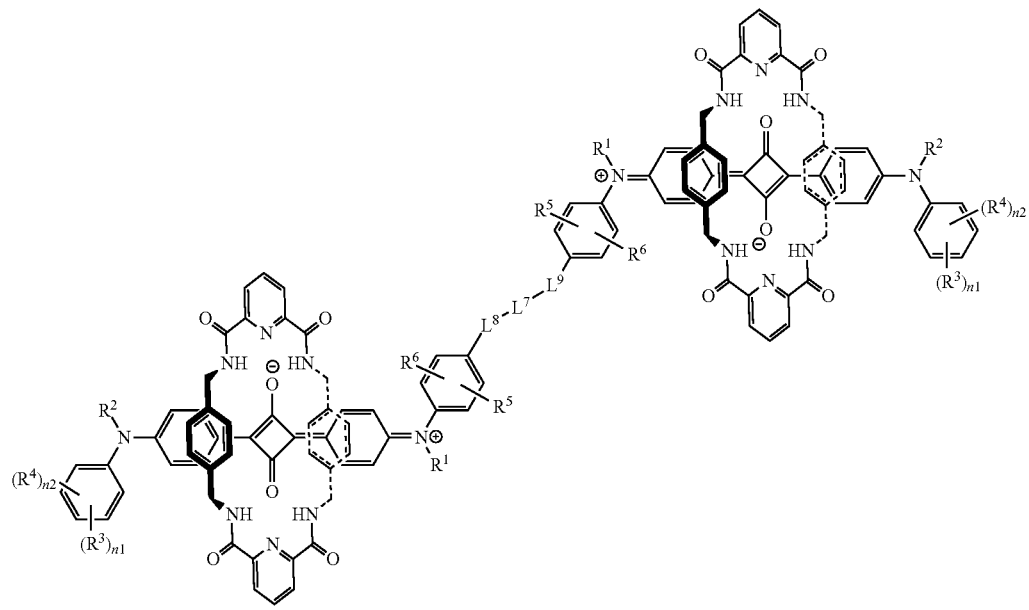
[Chemical Formula D-1]
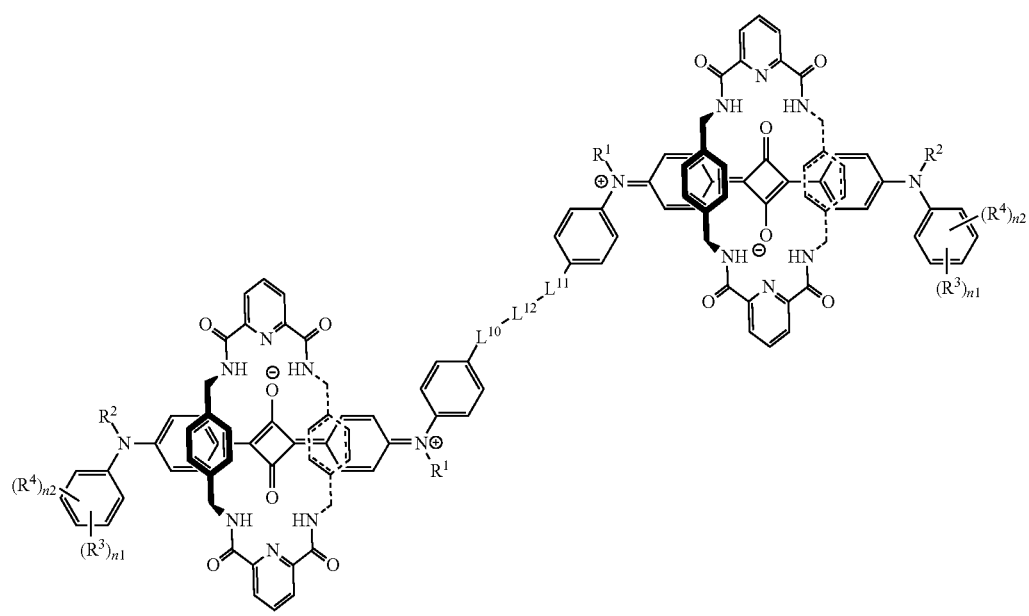

[Chemical Formula D-2]
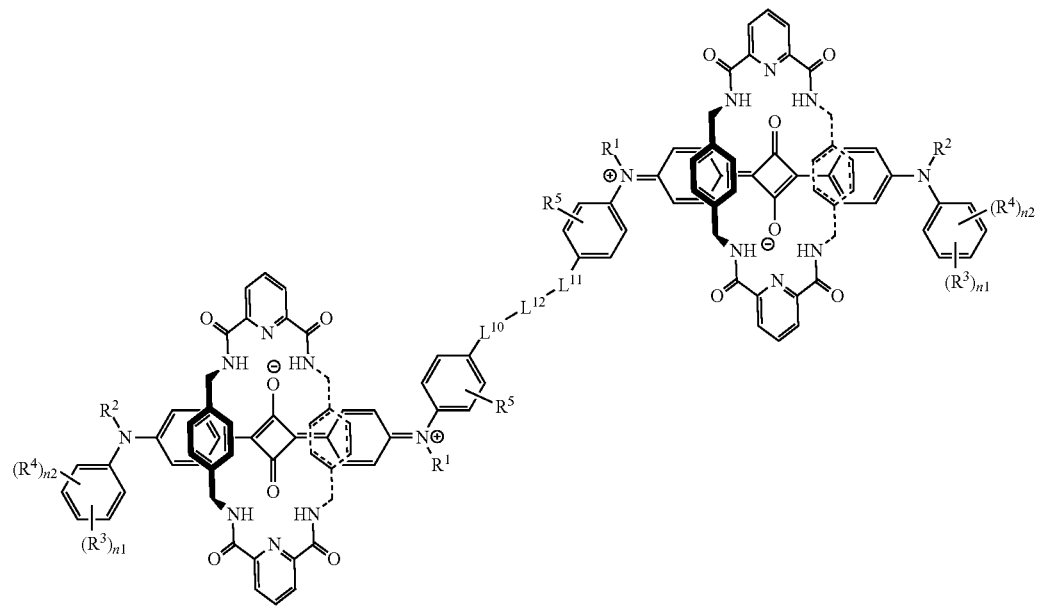
[Chemical Formula D-3]
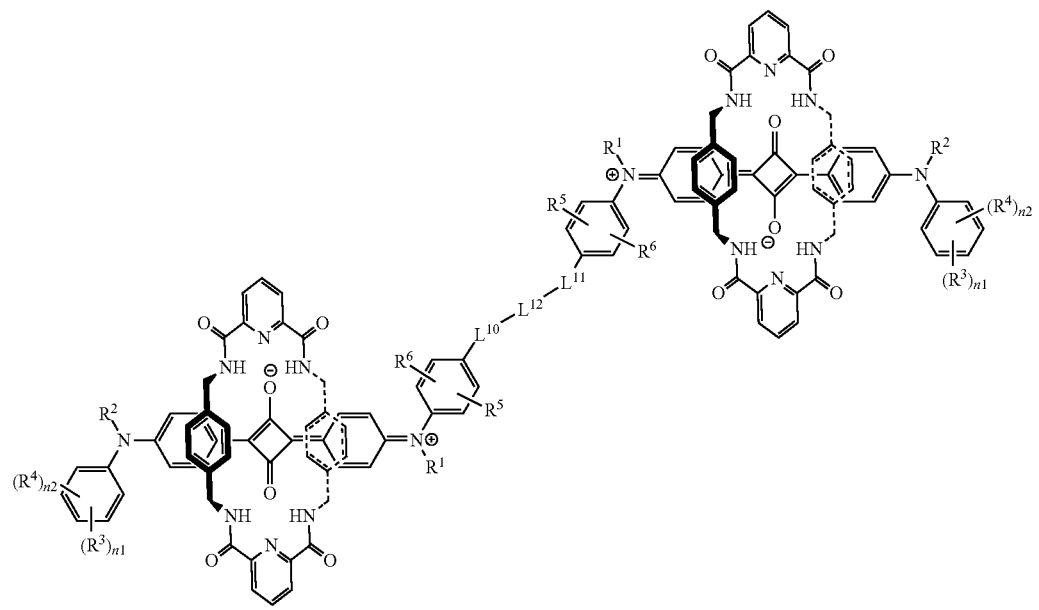

[Chemical Formula E-1]

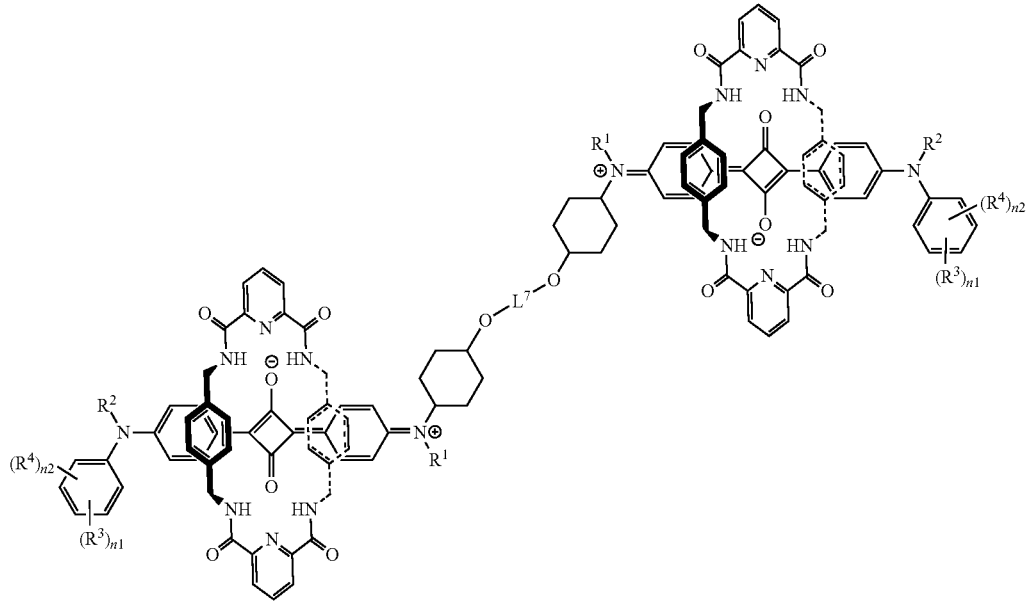

in Chemical Formula A-1 to Chemical Formula E-1,
$R^1$ to $R^4$ are each independently a halogen, a cyano group, a silane group, siloxane group, a substituted or unsubstituted epoxy group, a substituted or unsubstituted C2 to C20 alkenyl group, a substituted or unsubstituted C1 to C20 alkyl group, a substituted or unsubstituted C3 to C20 cycloalkyl group, a substituted or unsubstituted C1 to C20 alkoxy group, or a substituted or unsubstituted C6 to C20 aryl group,
$R^5$ and $R^6$ are each independently a substituted or unsubstituted C1 to C20 alkyl group,
$L^7$ is a substituted or unsubstituted C1 to C20 alkylene group,
$L^8$ and $L^9$ are each independently *—OC(=O)—* or *—C(=O)O—*,
$L^{10}$ and $L^{11}$ are each independently *—O(C=O)NH—* or *—NHC(=O)O—*,
$L^{12}$ is a substituted or unsubstituted C1 to C20 alkylene group or a substituted or unsubstituted C3 to C20 cycloalkylene group,
n1 and n2 are each independently an integer of 0 to 5, provided that 0≤n1+n2≤5, and
m is an integer of 2 to 20.

13. The compound as claimed in claim 1, wherein A and B each independently include the core and the shell in a mole ratio of about 1:1.

14. The compound as claimed in claim 1, wherein the compound represented by Chemical Formula 1 is a green dye.

15. A photosensitive resin composition comprising the compound as claimed in claim 1.

16. The photosensitive resin composition as claimed in claim 15, wherein the photosensitive resin composition further includes a binder resin, a photopolymerizable monomer, a photopolymerization initiator, and a solvent.

17. The photosensitive resin composition as claimed in claim 16, wherein the photosensitive resin composition further includes a pigment.

18. The photosensitive resin composition as claimed in claim 16, wherein the photosensitive resin composition further includes malonic acid, 3-amino-1,2-propanediol, a silane coupling agent having a vinyl group or a (meth)acryloxy group, a leveling agent, a surfactant, a radical polymerization initiator, or a combination thereof.

19. A color filter comprising the photosensitive resin composition as claimed in claim 15.

20. A CMOS image sensor comprising the color filter as claimed in claim 19.

* * * * *